United States Patent
Li et al.

(10) Patent No.: US 10,594,207 B2
(45) Date of Patent: Mar. 17, 2020

(54) PLUG-AND-PLAY RIPPLE PACIFIER FOR DC VOLTAGE LINKS IN POWER ELECTRONICS SYSTEMS AND DC POWER GRIDS

(71) Applicant: THE UNIVERSITY OF HONG KONG, Hong Kong (CN)

(72) Inventors: Sinan Li, Hong Kong (CN); Ting Leung Albert Lee, Hong Kong (CN); Siew Chong Tan, Hong Kong (CN); Shu Yuen Ron Hui, Hong Kong (CN)

(73) Assignee: THE UNIVERSITY OF HONG KONG, Hong Kong (CN)

( * ) Notice: Subject to any disclaimer, the term of this patent is extended or adjusted under 35 U.S.C. 154(b) by 0 days.

(21) Appl. No.: 15/771,320

(22) PCT Filed: Oct. 23, 2015

(86) PCT No.: PCT/CN2015/092649
§ 371 (c)(1),
(2) Date: Apr. 26, 2018

(87) PCT Pub. No.: WO2017/066985
PCT Pub. Date: Apr. 27, 2017

(65) Prior Publication Data
US 2019/0229609 A1    Jul. 25, 2019

(51) Int. Cl.
*H04M 1/15* (2006.01)
*H02M 1/15* (2006.01)
(Continued)

(52) U.S. Cl.
CPC ............... *H02M 1/15* (2013.01); *H02J 1/02* (2013.01); *H02M 7/217* (2013.01); *H02M 7/4826* (2013.01); *H03K 7/08* (2013.01)

(58) Field of Classification Search
CPC .... H02M 1/14; H02M 1/15; H02M 2001/123; H02M 1/126; H02M 7/125; H02M 7/217; H02M 7/4826
See application file for complete search history.

(56) References Cited

U.S. PATENT DOCUMENTS

| | | | |
|---|---|---|---|
| 5,513,090 A | 4/1996 | Bhattacharya et al. | |
| 6,424,207 B1 | 7/2002 | Johnson | |

(Continued)

FOREIGN PATENT DOCUMENTS

| | | | |
|---|---|---|---|
| CN | 101414764 A | 4/2009 | |
| CN | 102005762 A | 4/2011 | |

(Continued)

OTHER PUBLICATIONS

A. International Search Report and Written Opinion in corresponding PCT Application No. PCT/CN2015/092649, dated May 27, 2016.

(Continued)

*Primary Examiner* — Adolf D Berhane
(74) *Attorney, Agent, or Firm* — Leason Ellis LLP

(57) ABSTRACT

In many power electronics systems, there is an intermediate DC-link stage for facilitating the power processing of different sources to their loads. A device called a plug-and-play ripple pacifier (RP) directly plugged into the DC-link, and actively removes undesired DC-link ripple, thereby eliminating the reliance on electrolytes capacitors for stabilizing the system and remove ripple. Importantly, the use of this device is non-invasive to the operation of its host systems, and requires no modification of existing hardware. It is suitable for the protection of DC utilities/systems and can also be used as a direct replacement of ripple-canceling E-Caps in power converters device.

17 Claims, 15 Drawing Sheets

(51) Int. Cl.
H02J 1/02 (2006.01)
H02M 7/217 (2006.01)
H02M 7/48 (2007.01)
H03K 7/08 (2006.01)

(56) References Cited

U.S. PATENT DOCUMENTS

| | | | |
|---|---|---|---|
| 8,847,515 B2* | 9/2014 | King | H05B 33/0815 |
| | | | 315/307 |
| 2010/0027304 A1 | 2/2010 | Wang et al. | |
| 2012/0087159 A1 | 4/2012 | Chapman et al. | |
| 2016/0333856 A1* | 11/2016 | Zabalza | H02H 7/06 |

FOREIGN PATENT DOCUMENTS

| | | |
|---|---|---|
| CN | 102025145 A | 4/2011 |
| CN | 104078992 A | 10/2014 |
| CN | 104205605 A | 12/2014 |
| WO | WO 2010071855 A2 | 6/2010 |
| WO | WO 2013152785 A1 | 10/2013 |

OTHER PUBLICATIONS

L. Gu et al., "Means of eliminating electrolytic capacitor in AC/DC power supplies for LED lightings," IEEE Trans. Power Electron., vol. 24, No. 5, pp. 1399 1408, (May 2009).
B. Lehman et al., "Proposing measures of flicker in the low frequencies for lighting applications," IEEE Energy Conversion Congress and Exposition, (2011), pp. 2865-2872.
A. Wilkins et al., "LED lighting flicker and potential health concerns: IEEE standard PA RI7 89 update," IEEE Energy Conversion Congress Exposition, 2010), pp. 171-178.
T. Shimizu and T. Fujita et al., "A unity power factor PWM rectifier with DC ripple compensation," IEEE Trans. Ind. Electron., vol. 44, No. 4, pp. 447-455, (1997).
T. Shimizu and Y. Jin et al., "DC ripple current reduction on a single-phase PWM voltage-source rectifier," IEEE Trans. Ind. Appl., vol. 36, No. 5, pp. 1419-1429, (2000).
P. T. Krein et al., "Minimum energy and capacitance requirements for single-phase inverters and rectifiers using a ripple port," IEEE Trans. Power Electron., vol. 27, No. 11, pp. 4690-4698, (Nov. 2012).
S.H. Lee et al., "Mitigation of low frequency AC ripple in single-phase photovoltaic power conditioning systems," J. power Electron., vol. 10, No. 3, pp. 328-333, (2010).
S. Wang et al., "A flicker-free electrolytic capacitor-less AC-DC LED driver," IEEE Trans. Power Electron., vol. 27, No. 11, pp. 4540-4548. (Nov. 2012).
G.R. Zhu et al., "Mitigation of low frequency current ripple in fuel-cell inverter systems through waveform control," IEEE Trans. Power Electron., vol. 28, No. 2, pp. 779-792, (Feb. 2013).
M. Su et al., An active power decoupiing method for single-phase AC DC converters, IEEE Trans. Ind. Informatics, vol. 10, No. 1, pp. 461-468, (Feb. 2014).
H. Li et al., "Active power decoupling for high power single-phase PWM rectifiers," IEEE Trans. Power Electron., vol. 28, No. 3, pp. 1308-1319, (Mar. 2013).
L. Gu. et al. article, the G.R Zhu et al. article, B. Wang et al., "A method of reducing the peak-to-average ratio of LED current for electrolytic capacitor-less AC-DC drivers," IEEE Trans. Power Electron., vol. 25, No. 3, pp. 592-601, (Mar. 2010).
X. Ruan et al., "Optimum injected current harmonics to minimize peak-to-average ratio of LED current for electrolytic capacitor-less AC DC drivers," IEEE Trans. Power Electron., vol. 26, No. 7, pp. 1820-1825, (Jul. 2011).
Feng Gao et al., "Indirect DC-link voltage control of two-stage single-phase PV inverter," IEEE Energy Conversion Congress and Exposition, (2009), pp. 1166-1172.

Y.M. Chen et al., "DC-link capacitor selections for the single-phase grid-connected PV system," 2009 International Conference on Power Electronics and Drive Systems(FEDS), (2009), pp. 72-77.
T. Shimizu, et al. article; P.T. Krein, et al. article; A.C. Kyritsis et al., "A novel parallel active filter for current pulsation smoothing on single stage grid-connected AC-PV modules," European Conf. on Power Elect.and Appl., (2007), pp. 1-10.
W. Chen et al., "Elimination of an electrolytic capacitor in AC/DC Light-Emitting Diode (LED) driver with high input power factor and constant output current," IEEE Trans. Power Electron., vol. 27, No. 3, pp. 1598-1607, (Mar. 2012).
W. Qi et al., "A novel active power decoupling single-phase PWM rectifier topology," IEEE Applied Power Electronics Conference and Exposition, (2014), pp. 89-95.
Y. Tang et al., "Decoupling of fluctuating power in single-phase systems through a symmetrical half-bridge circuit," IEEE Applied Power Electronics Conference and Exposition, (2014), pp. 96-102.
R. Wang et al., "A high power density single-phase PWM rectifier with active ripple energy storage," IEEE Trans. Power Electron., vol. 26, No. 5, pp. 1430-1443, (May 2011).
Krein et al., "Minimum energy and capacitance requirements for single-phase inverters and rectifiers using a ripple port," IEEE Trans. Power Electron., vol. 27, No. 11, pp. 4690-4698, (Nov. 2012).
M. Su, el.al., H. Li, et al., Y Tang, et. al., and P. T. Krein and R. S. Balog, "Cost-effective hundred-year life for single-phase inverters and rectifiers in solar and LED lighting applications based on minimum capacitance requirements and a ripple power port," IEEE Applied Power Electronics Conference and Exposition, (2009), pp. 620-625.
M. Su, et al. article and R Teodorescu, et al., "A new control structure for grid-connected LCL PV inverters with zero steady-state error and selective harmonic compensation," IEEE Applied Power Electronics Conference and Exposition, (2004), vol. 1, pp. 580-586.
M. Steinbuch, "Repetitive control for systems with uncertain period-time," Automatic, vol. 38, No. 12, pp. 2103-2109, (Dec. 2002).
S. K. Maddula and J. C. Balda, "Lifetime of electrolytic capacitors in regenerative induction motor drives," IEEE Power Electronics Specialists Conference, (2005), pp. 153-159.
S. A Khalehoddin, et al., "DC-bus design and control for a single-phase grid-connected renewable converter with a small energy storage component," IEEE Trans. Power Electron., vol. 28, No. 7, pp. 3245-3254, (Jul. 2013).
X. Zhang et al.. "Adaptive Active Capacitor Converter for Improving Stability of Cascaded DC Power Supply System," IEEE Trans. Power Electron., vol. 28, No. 4, pp. 1807-1816, (Apr. 2013).
European First Office Action in corresponding European Application No. 15906503.6, dated Dec. 19, 2019.
Chinese First Office Action in corresponding Chinese Application No. 201580085552.X, dated Nov. 5, 2019 (an English translation attached hereto).
Extended European Office Action in corresponding European Application No. 15906503.6, dated Apr. 29, 2019.
Qing-Chang Zhong, "Active Capacitors: Concept and Implementation," IEEE Industrial Electronics (ISIE), 2012, IEEE International Symposium ON, IEEE, May 28, 2012, pp. 149-153, XP032199706.
Shagerdmootaab Ali et al, "Active capacitor implementation using nonlinear state-space model of bidirectional buck and boost converter," IECON 2014—40TH Annual Conference of the IEEE Industrial Electronics Society, IEEE, Oct. 29, 2014 (Oct. 29, 2014), pp. 5088-5093, XP032739288, DOI: 10.1109/IECON.2014. 704927.
Yona Guy et al, "The virtual infinite capacitor." 2014 IEEE 28TH Convention of Electrical & Electronics Engineers in Israel (IEEEI), IEEE, Dec. 3, 2014 (Dec. 3, 2014), pp. 1-5, XP032719249, DOI: 10.1109/EEEI.2014.7005843 [retrieved on Jan. 9, 2015].

* cited by examiner

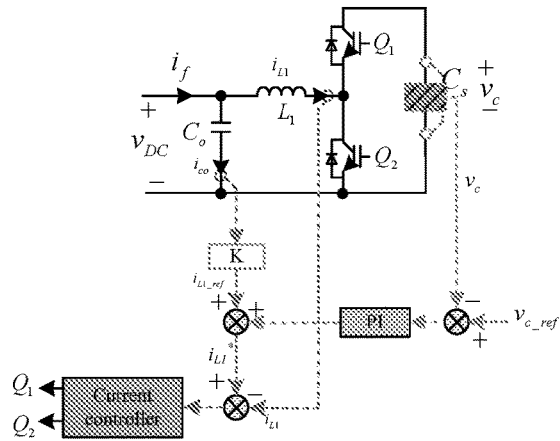 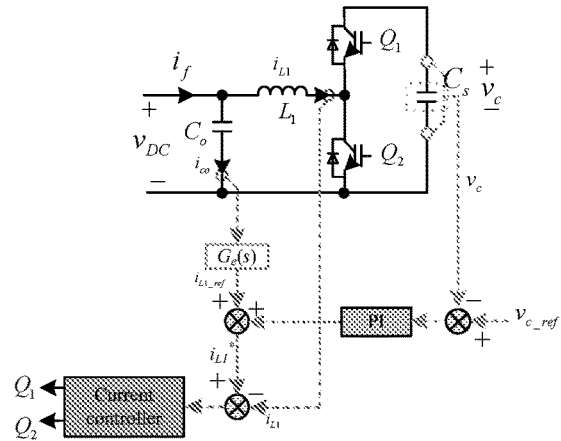
Fig. 18(a)                    Fig. 18(b)
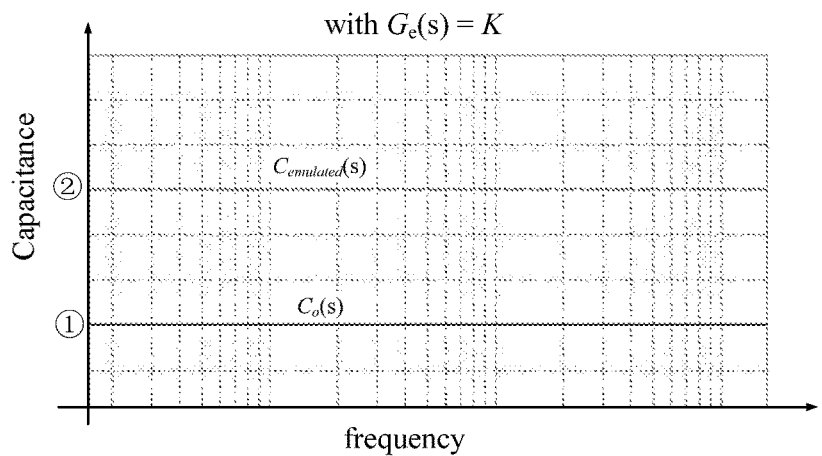
Fig. 19.

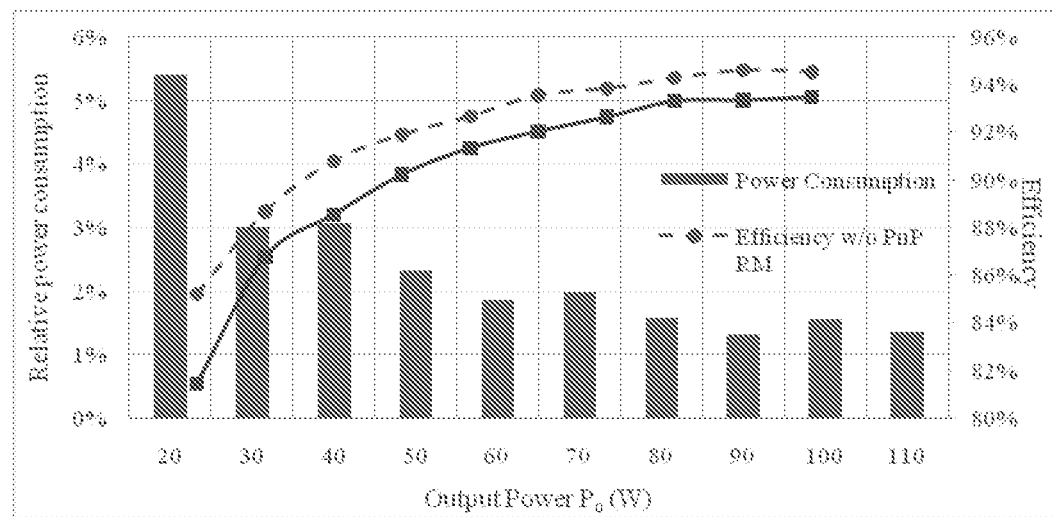
Fig. 25.
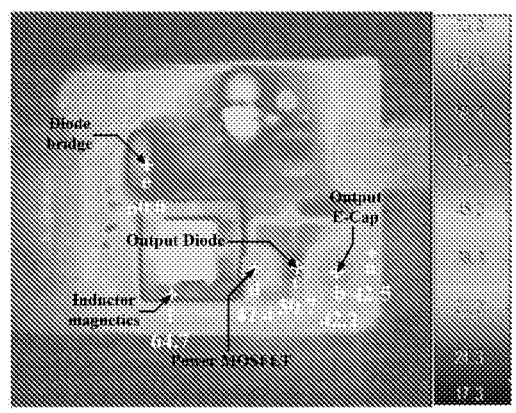 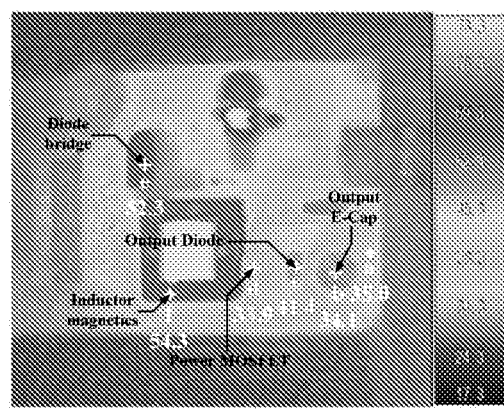
Fig. 26(a)          Fig. 26(b)

PLUG-AND-PLAY RIPPLE PACIFIER FOR DC VOLTAGE LINKS IN POWER ELECTRONICS SYSTEMS AND DC POWER GRIDS

CROSS-REFERENCE TO RELATED PATENT APPLICATIONS

This application is a U.S. National Phase Application under 35 U.S.C. § 371 of International Patent Application No. PCT/CN2015/092649, filed Oct. 23, 2015, which is incorporated by reference in its entirety. The International Application was published on Apr. 27, 2017 as International Publication No. WO 2017/066985 A1.

FIELD OF THE INVENTION

The current invention relates to achieving ripple mitigation and stabilization of DC utilities and systems using a device that is fully independent of the operation of existing power electronic equipment and electrical appliances connected to DC-link infrastructure.

BACKGROUND OF THE INVENTION

In recent years, with emerging distributed renewable power generation, such as photovoltaic power generation, there has been a renewed interest in dc power grids. It is envisaged that a mixture of traditional AC power grids and emerging dc power grids will become a new form of power gird for the future. For a DC power grid provided by an AC power source, the AC voltage has to be rectified into DC voltage. In the process, voltage at double the mains frequency (e.g. 100 Hz for a 50 Hz mains) may be present as ripple in the dc voltage link unless a very large capacitor is used to provide energy buffering between the AC power source and the loads of the DC voltage link. Like the AC power systems, the DC power systems have voltage regulation requirements. Also, the dc link voltage is subject to disturbances for various reasons, such as sudden changes of large loads and power mismatches between power supply and demand For most power electronics applications that require AC/DC and DC/AC conversions, and some that require DC/DC conversions, there is an intermediate DC-link interface to facilitate the power conversion as illustrated in FIG. 1. These applications are generally applied at two levels: (1) utility (appliance) level, (e.g. lighting systems, electrical vehicle (EV) battery charging and motor drives) and (2) power generation level (e.g. wind turbines and photovoltaic micro-grid power systems). For both levels of applications, it is crucial to guarantee a stable and reliable operation of the DC-link to which one or several DC devices or down-stream converters are connected.

A large variation of the DC-link voltage will cause efficiency and performance degradation of its cascading converters and will significantly increase a system's voltage stress. See, L. Gu et al., "Means of eliminating electrolytic capacitor in AC/DC power supplies for LED lightings," *IEEE Trans. Power Electron.*, vol. 24, no. 5, pp. 1399-1408, (May 2009). It may also lead to other undesirable issues. For instance, the variation of the DC-link in LED applications can lead to light flicker, which is detrimental to human health. See for example, B. Lehman et al., "Proposing measures of flicker in the low frequencies for lighting applications," *IEEE Energy Conversion Congress and Exposition*, (2011), pp. 2865-2872 and A. Wilkins et al., "LED lighting flicker and potential health concerns: IEEE standard PAR1789 update," *IEEE Energy Conversion Congress and Exposition*, (2010), pp. 171-178. In electric vehicle (EV) battery charging applications, the ripple power can heat up the batteries, thereby reducing their lifetime. T. Shimizu and T. Fujita et al., "A unity power factor PWM rectifier with DC ripple compensation," *IEEE Trans. Ind. Electron.*, vol. 44, no. 4, pp. 447-455, (1997) and T. Shimizu and Y. Jin et al., "DC ripple current reduction on a single-phase PWM voltage-source rectifier," *IEEE Trans. Ind. Appl.*, vol. 36, no. 5, pp. 1419-1429, (2000). In photovoltaic ("PV") applications, the variation can reduce the power efficiency of the PV panels as disclosed in P. T. Krein et al., "Minimum energy and capacitance requirements for single-phase inverters and rectifiers using a ripple port," *IEEE Trans. Power Electron.*, vol. 27, no. 11, pp. 4690-4698, (November 2012). See also, S. H Lee et al., "Mitigation of low frequency AC ripple in single-phase photovoltaic power conditioning systems," *J. power Electron.*, vol. 10, no. 3, pp. 328-333, (2010).

The voltage variation of the DC-link can be a steady-state oscillation or a transient disturbance. Essentially, these variations are caused by the instantaneous power difference between the total input power injected into and the total output power extracted from the DC-link. Major contributors to steady-state oscillation in the DC-link are the single-phase AC/DC or DC/AC systems, which inherently possess a double-line-frequency (100 Hz or 120 Hz) power difference between their AC input and DC output at steady state. S. Wang et al., "A flicker-free electrolytic capacitor-less AC-DC LED driver," *IEEE Trans. Power Electron.*, vol. 27, no. 11, pp. 4540-4548, (November 2012); G. R. Zhu et al., "Mitigation of low-frequency current ripple in fuel-cell inverter systems through waveform control," *IEEE Trans. Power Electron.*, vol. 28, no. 2, pp. 779-792, (February 2013); M. Su et al., "An active power-decoupling method for single-phase AC-DC converters," *IEEE Trans. Ind. Informatics*, vol. 10, no. 1, pp. 461-468, (February 2014); and H. Li et al., "Active power decoupling for high-power single-phase PWM rectifiers," *IEEE Trans. Power Electron.*, vol. 28, no. 3, pp. 1308-1319, (March 2013). Other contributors to DC-link variations include the presence of AC side harmonics, load transient, etc.

The simplest and most conventional approach to improving the stability of the DC-link voltage is to insert one or more parallel capacitors C into the DC-link interface, as shown in FIG. 1. The capacitors are typically electrolytic or E-Cap ones due to their high energy density (space-saving) and cost effective nature. However, their relatively short lifetimes pose critical challenges to the lifetime and reliability of the overall system. With the increasingly stringent reliability requirement needed in power, aerospace, automotive, and general lighting systems, a more reliable method of stabilizing the DC-link without the use of E-Caps is required. In particular, large voltage ripple across electrolytic capacitors leads to large capacitor current ripple and thus internal resistive loss and temperature rise inside the electrolytic capacitor.

Recently, various solutions involving the use of small long-lifetime capacitors (e.g. film caps) to stabilize the DC-link voltage of such systems have been proposed. One such solution is to intentionally reduce the instantaneous input-and-output power difference by manipulating the input and/or output operation waveforms of the power electronics. See the L. Gu, et al. article, the G. R Zhu et al. article, B. Wang et al., "A method of reducing the peak-to-average ratio of LED current for electrolytic capacitor-less AC-DC drivers," *IEEE Trans. Power Electron.*, vol. 25, no. 3, pp.

592-601, (March 2010); X. Ruan et al., "Optimum injected current harmonics to minimize peak-to-average ratio of LED current for electrolytic capacitor-less AC-DC drivers," *IEEE Trans. Power Electron.*, vol. 26, no. 7, pp. 1820-1825, (July 2011); Feng Gao et al., "Indirect DC-link voltage control of two-stage single-phase PV inverter," *IEEE Energy Conversion Congress and Exposition*, (2009), pp. 1166-1172 and Y. M. Chen et al., "DC-link capacitor selections for the single-phase grid-connected PV system," 2009 *International Conference on Power Electronics and Drive Systems (PEDS)*, (2009), pp. 72-77.

Methods based on this solution are cost effective, requiring only a change of the control, with no modification of the existing hardware. However, they are achieved at the expense of sacrificing the system's performance in terms of having a high power factor (PF) and good total harmonics distortion (THD), good voltage regulation and high efficiency. See, the L. Gu, et al., B. Wang, et al., X. Ruan, et al., Feng Gao, et al., Y. M Chan, et al. and G.-R. Zhu, et al. articles. Thus, this solution is only eligible for applications with less stringent regulatory requirements.

Another solution is to incorporate additional circuits with controls that decouple the input-and-output power difference of the power electronics, as separate ripple power components. These circuits act as separate energy storage components that do not require an E-cap. Methods based on this solution are considered "active-filter" based. Except for a small loss of power efficiency, these methods typically cause little degradation of the system's performance. See the T. Shimizu, et al. article; P. T. Krein, et al. article; A. C. Kyritsis et al., "A novel parallel active filter for current pulsation smoothing on single stage grid-connected AC-PV modules," *European Conf. on Power Elect. and Appl.*, (2007), pp. 1-10; W. Chen et al., "Elimination of an electrolytic capacitor in AC/DC Light-Emitting Diode (LED) driver with high input power factor and constant output current," *IEEE Trans. Power Electron.*, vol. 27, no. 3, pp. 1598-1607, (March 2012); W. Qi et al., "A novel active power decoupling single-phase PWM rectifier topology," *IEEE Applied Power Electronics Conference and Exposition*, (2014), pp. 89-95; Y. Tang et al., "Decoupling of fluctuating power in single-phase systems through a symmetrical half-bridge circuit," *IEEE Applied Power Electronics Conference and Exposition*, (2014), pp. 96-102; and R. Wang et al., "A high power density single-phase PWM rectifier with active ripple energy storage," *IEEE Trans. Power Electron.*, vol. 26, no. 5, pp. 1430-1443, (May 2011). These energy storage devices have relatively longer lifetimes. Thus, the E-Cap can be eliminated and overall system reliability can be enhanced.

However, the need to incorporate additional circuits mandates that existing power electronics hardware in pre-existing installations must undergo modification and re-design. This significantly increases the overall system's cost at both manufacturers' and consumers' ends. For the power generation level of applications, modification of hardware on-line is generally prohibited.

SUMMARY OF THE INVENTION

The present invention is related to methods and systems that can be applied to the dc voltage link of a power electronic system, a dc power grid or a distributed dc power system to provide multiple functions such as voltage ripple reduction and active power filtering. The device can either be (i) designed specifically for providing special functions such as active power filtering and impedance emulation or (ii) a general programmable one that can be programmed to perform the required functions.

In a particular embodiment it is directed toward an alternative concept that involves a simple and low-cost ripple mitigation device for DC utilities and systems. The objective is to achieve ripple mitigation and stabilization of the DC utilities and systems using a device that is fully independent of the operation of existing power-electronic equipment and electrical appliances connected to the DC-link infrastructure. In order to operate it only needs to detect the DC-link voltage. Therefore, with this solution, no modification of existing hardware is required. Instead, the approach involves a device that can be referred to as a "plug-and-play Ripple Pacifier (RP)" (as shown in FIG. 2). This RP device can be directly plugged into the DC-link interface such that it will independently work to remove the steady-state ripple power oscillation on the DC-link that is caused by AC/DC or DC/AC power conversions. Importantly, while providing a stable DC-link operation, the RP does not interfere and is non-invasive to the operation of all other power-electronic equipment and electrical appliances on the system.

An AC/DC or DC/AC system (herein simply referred to as an AC/DC system) with the power decoupling function can be described using the three port model shown in FIG. 3, where there is an AC port, a DC port, and a ripple port. See, Krein et al., "Minimum energy and capacitance requirements for single-phase inverters and rectifiers using a ripple port," *IEEE Trans. Power Electron.*, vol. 27, no. 11, pp. 4690-4698, (November 2012), which is incorporated herein by reference in its entirety. The ripple port, to which an energy storage component is connected, acts to absorb all the necessary ripple power presented on the DC port. It can be linked to the AC/DC system in numerous ways, such as to the AC port [See, G.-R. Zhu, et al., article which is incorporated herein by reference in its entirety], the DC port [A. C. Kyritsis, et al., and Y. Tang, et al., articles which are incorporated herein by reference in their entirety], the inverter leg [M. Su, et al. and H. Li, et al., which are incorporated herein in their entirety] or the high-frequency AC-link [T. Shimizu, et al. and P. T. Krein, et al., which are incorporated herein by reference in their entirety].

The liquefied chemical contained in E-Caps evaporates gradually over time due to heat and utilization. This leads to a decrease in the effective capacitance and therefore an increase in the low-frequency voltage ripple at the DC port. The use of an RP to absorb existing ripple power due to the degradation of the E-Caps will eliminate this low-frequency voltage ripple from the line, and thereby protect the normal functioning of the DC utilities. By ensuring a more stable DC-link, the junction temperatures of all components of the power electronics connected to the DC-link (i.e., power semiconductors, magnetics, E-Caps) will be reduced, thereby improving the overall system's reliability. For instance, with the RP absorbing the ripple power, there is minimal flow of low-frequency current in the E-Caps, which means reduced utilization and heating, and consequently, the prolonging of their lifespan.

As an active power filter or ripple pacifier, another advantage of the invention is that the practical impedance used in the programmable device can be much smaller than the emulated impedance, making it possible to use non-electrolytic capacitors. Applications of the proposed plug-and-play device include at least, but not limited to, voltage ripple pacifiers and active power filters.

Additionally, if the RP is made sufficiently compact, e.g. similar to the size of an E-Cap, it can be used as a discrete component in the form of an Active Electronic Capacitor. Thus, other than being applied to DC-link systems, the RP can be used to directly replace short-lifetime E-Caps in power supplies and equipment. In this respect, the RP can be modularized and arranged in parallel-series configurations, which can be beneficial to high power or distributed power system applications, where "hot swapping" of faulty units can be easily performed without interrupting the normal functioning of the system. Both the hardware and the control of the RP are simple and of low cost.

It is important to note that the RP can be further enhanced to include the additional feature of alleviating transient disturbance on the DC-link. This is useful for applications involving fast dynamic power changes of source or load.

The device of the present invention has the following advantages:—
A. Compared to most of the existing prior art systems, it requires no additional sensors installed into the existing DC system for measuring the system status. Only the DC-link voltage/current information is required.
B. The use of the proposed method will only regulate the ripple (high frequency) content in the DC-link voltage and will not affect the averaged DC value of the DC-link voltage.
C. It will not cause instability issues for exiting DC systems.

BRIEF DESCRIPTION OF THE DRAWINGS

The foregoing and other objects and advantages of the present invention will become more apparent when considered in connection with the following detailed description and appended drawings in which like designations denote like elements in the various views, and wherein:

FIG. 4(a) is an AC port, FIG. 4(b) is a DC port, FIG. 4(c) is an inverter leg and FIG. 4(d) is a high-frequency ac-link;

FIG. 6(a) is the voltage waveforms and FIG. 6(b) is the current waveforms;

FIG. 6(a) is for k=1 and FIG. 7(b) is for k=1.25;

FIG. 18 is a control block of the proposed RP for emulating in FIG. 18(a) a capacitor of KCo and in FIG. 18(b) a general impedance of 1/(sGe(s)Co);

FIG. 19 is a graph of the capacitance of $C_o$ and $C_{emulated}$ in the frequency domain when $G_e(s)$ is a proportional gain of K (the effect of the low-pass filter is neglected);

FIG. 20(a) is without RP; FIG. 20(b) is with RP using a PR controller of 100 Hz resonant frequency; and FIG. 20(c) is with RP using a multi-PR controller of resonant frequencies of 100 Hz, 200 Hz and 300 Hz;

FIG. 22 shows graphs of experimental results of the steady-state operation waveforms and FFT results of the DC-link voltage for the case of FIGS. 22(a), 22(b) which is without RP; FIGS. 22(e), 21(f) with RP using multi-PR controller of resonant frequencies of 100 Hz, 200 Hz and 300 Hz;

FIG. 25 shows the relative power consumed by the RP for different output power and a comparison of power efficiency of the AC/DC system with and without the use of RP;

FIG. 26 is the thermal image and point temperature (in ° C.) of the boost PFC circuit board without RP (FIG. 26(a)) and with RP (FIG. 26(b))

DETAILED DESCRIPTION OF EXEMPLARY EMBODIMENTS OF THE INVENTION

Figure 3:
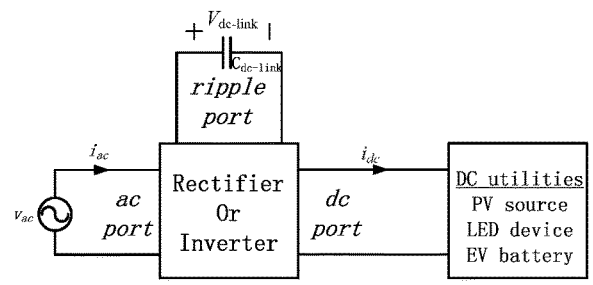
FIG. 3 shows a three port model of an AC/DC system.

As shown in FIG. 3, at the ripple port there is an energy storage device that absorbs only the DC voltage ripple. As a result the E-Cap next to the ripple port becomes optional. Besides, the current invention is connected in parallel with the DC utilities at the DC-link interface, thus it can be plugged into the system without any modification (plug-and-play).

Therefore, for AC/DC systems, the current invention can eliminate the use of E-Caps to improve the overall system stability. For existing system with pre-installed E-Caps, it can also serve as a protection apparatus to slow down the degradation of the E-Caps. For integrated systems, the current invention can replace short-lifetime E-Caps directly to improve the lifetime of the application.

Figure 4:
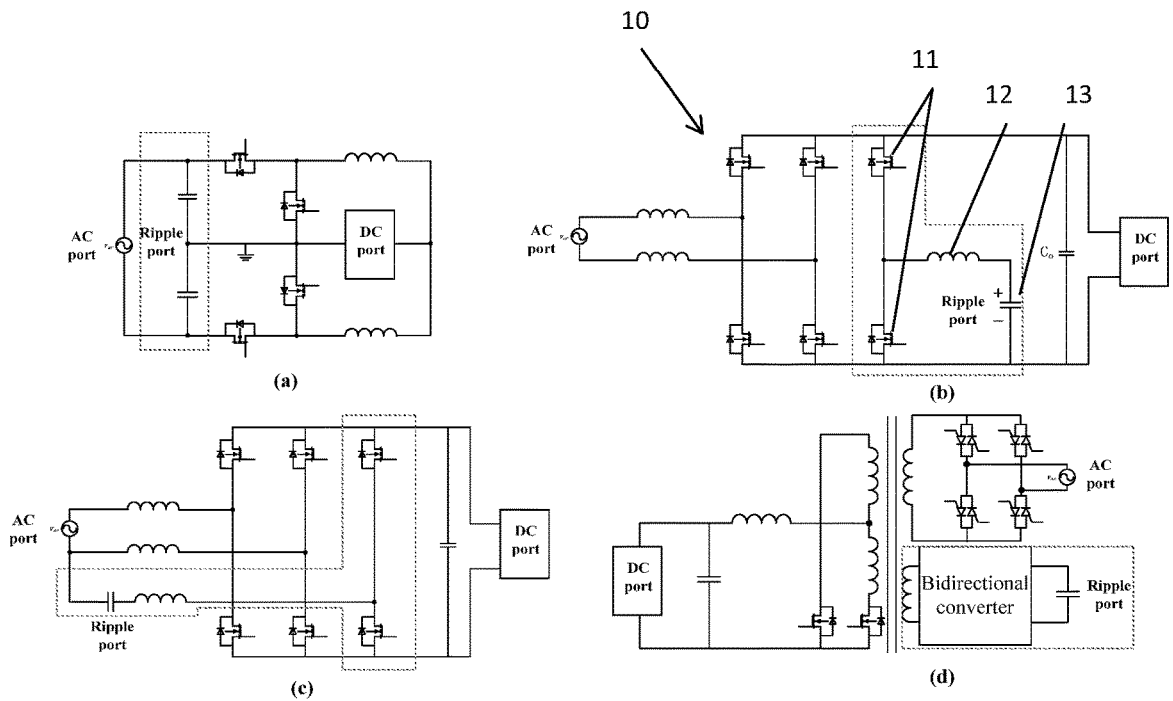
FIG. 4 illustrates various circuit diagrams with different ripple port configurations. i.e.

FIG. 4 shows various illustrative examples of circuits related to each kind of ripple port configurations. In each figure the circuit for performing the ripple pacifying function is shown in dotted lines. The input side represents the ac port and the DC port is also labelled as shown in FIG. 3. Switches are provided in the circuits to connect the energy storage device of the present invention to the DC port at the correct time to eliminate the ripple. Clearly, configurations with the ripple port in parallel with the DC port (see FIG. 4(b)) have the advantage that the ripple port can be easily attached to or detached from the system, without disruption to the functional operation of existing AC or DC utilities. This provides the possibility of attaining a plug-and-play RP functionality. However, it should be noted that not all configurations in FIG. 4 are suitable for 'plug-and-play' application. To be qualified for 'plug-and-play' application, the device should (i) have two terminals only for the dc voltage link and (ii) require only the DC link voltage as input variable for its control. All necessary variables or references for control (such as the reference of $i_f$) should be able to be derived from the information of $v_{DC}$ for a shunt programmable device according to this invention. There should not be any need to implement any other sensor for measuring other variables such as the input AC voltage ($v_{ac}$), input AC current ($i_{ac}$), the supply current from the DC voltage source ($i_s$) and the load current ($i_o$). Therefore, a true "plug-&-play" device should be non-intrusive to the existing host system. If the shunt device is designed or programmed as an active filter, it can operate as an independent device to remove the DC bus voltage ripple. Similarly, for a series device, the control schematic should require the information of the series current ($i_o$) only.

Using FIG. 4(b) as an example the AC source and the four diodes with switches across them form a full wave rectifier 10 to generate DC voltage that is to be applied to the DC port. The switches 11 within the dotted line selectively connect the inductor 12 and capacitor 13 to the DC line to remove the ripple. An E-cap is additionally shown across the DC port. Alternative configurations are shown in the other schematics of FIG. 4.

Figure 5A:
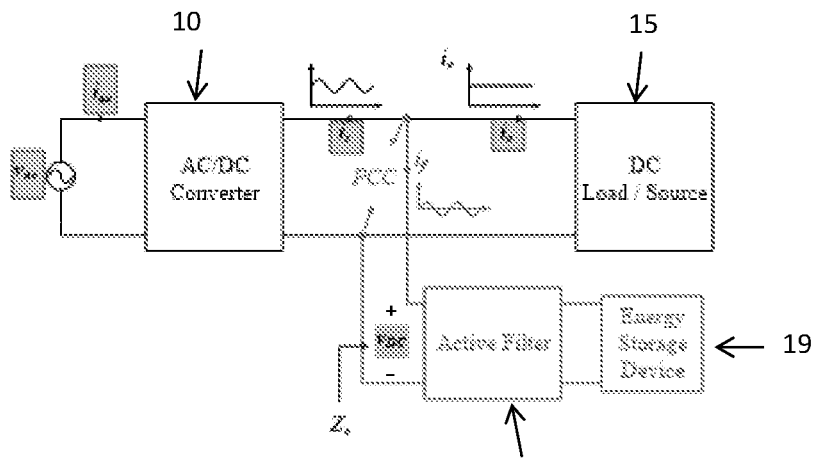
FIG. 5(a) is a block diagram of a simplified DC system showing a ripple pacifier in the form of an active filter and FIG. 5(b) is the circuit model of a practical boost PFC rectifier.

According to the present invention a ripple pacifier (RP) is connected across a DC grid and it actively changes its impedance to absorb ripple. FIG. 5(a) shows a simple block diagram, as opposed to the schematics of FIG. 4 of such an arrangement. In FIG. 5(a) a simplified DC system is shown, which comprises an AC/DC converter 10 (e.g. a rectifier or an inverter), a DC source/load 15, and the active filter (switches 17) and energy storage devices 19 of the present invention. The "shunt" active filter 17 is coupled with the DC bus of the system via the point of common coupling (PCC), and can actively remove any undesired disturbances on the DC bus by introducing a current $i_f$ into the DC bus. With such configuration, the active filter has the possibility to realize plug-and-play functionality.

Figure 5B:
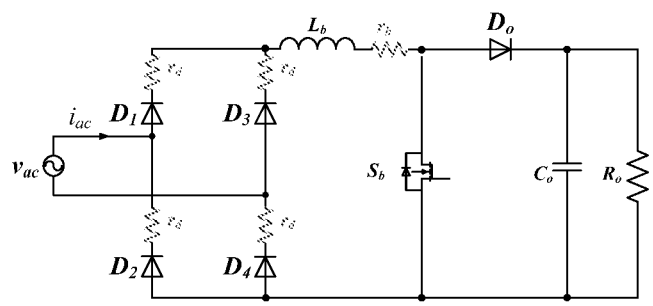

In order to better understand the present invention a mathematical description of the double-line frequency ripple power present in single-phase AC/DC systems is derived using a conventional boost PFC rectifier (see FIG. 5(b)) as an example. Here, the circuit comprises a front-end diode bridge (D1-D4), a boost PFC converter ($L_b$, $S_b$ and Do) and a capacitor Co that is in parallel with the DC load Ro. Series resistances rb and rd are incorporated in the circuit model to reflect the conduction losses of the inductor and the diodes, respectively.

The input of the rectifier is assumed to be of unity power factor such that the AC side voltage and current are $$v_{ac} = V_s \sin(\omega t) \quad (1)$$

$$i_{ac} = I_s \sin(\omega t) \quad (2)$$

where $v_{ac}$ and $i_{ac}$ are the instantaneous line voltage and current, and $V_s$ and $I_s$ are their amplitude, respectively. The current flowing through $L_b$ is the rectified form of the AC input current. Therefore, the instantaneous storage power of the inductor is $$p_L = \frac{dE_L}{dt} = \frac{d\left(\frac{1}{2}L_b|i_{ac}|^2\right)}{dt} = \frac{1}{2}\omega L_b I_s \sin(2\omega t) \quad (3)$$

where $E_L$ is the instantaneous energy stored in the inductor.

The total conduction loss of the rectifier can be expressed as $$p_{cond} = i_{ac}^2(r_b + 2r_d) = \frac{1}{2}I_s^2(r_b + 2r_d)[1 - \cos(2\omega t)] \quad (4)$$

Taking Equations (3) and (4) into consideration, the instantaneous power $p_{AC}$ that is delivered to the DC port is given as $$p_{AC} = v_{ac}i_{ac} - p_L - p_{cond} \quad (5)$$

$$= \underbrace{\frac{1}{2}I_s[V_s - I_s(r_b + 2r_d)]}_{p_{DC}} -$$

$$\underbrace{\frac{1}{2}I_s V_s \cos(2\omega t) - \frac{1}{2}\omega L_b I_s^2 \sin(2\omega t) + \frac{1}{2}I_s^2(r_b + 2r_d)\cos(2\omega t)}_{p_r = p_{2\omega}}$$

Equation (5) clearly shows that $P_{AC}$ contains two components: a constant DC component $P_{DC}$ and a double-line frequency component $P_{2\omega}$. Here, $P_{DC}$ should be equal to the real power required by the DC load, while $P_{2\omega}$ is the instantaneous power difference between the AC input and the DC output, which is equivalent to the ripple power $p_r$, i.e., $$p_r = p_{2\omega} = -\frac{1}{2}I_s[V_s - I_s(r_b + 2r_d)]\cos(2\omega t) - \frac{1}{2}\omega L_b I_s^2 \sin(2\omega t). \quad (6)$$

From Equation (6), it can be seen that pr is introduced by the line voltage and current, and is a function of Lb, rb and rd. The ripple power pr will pass through the filtering capacitor Co and will generate a double-line frequency voltage ripple across it. A smaller capacitor can lead to a significantly high voltage ripple across the DC load device, which is typically undesired.

In order to prevent the low-frequency voltage ripple from appearing at the input of the DC load device, Pr can be externally decoupled from the circuit, which is then stored into a separate inductive or capacitive storage device. An inductive means of energy storage is usually avoided due to its low power density and high power losses. Therefore, only the capacitive means of energy storage device is set forth.

Without losing generality, Pr which is set forth in Equation (6) can be expressed as $$p_r = P_R \sin(2\omega t + \varphi) \quad (7)$$

where $P_R$ and $\varphi$ are the amplitude and the phase of Pr, respectively. Given that the voltage of the storage device's capacitor $C_s$ is $v_{CS}$, its capacitor current $i_{CS}$ will be $$i_{CS} = C_s \frac{dv_{CS}}{dt}. \quad (8)$$

Since the power in $C_s$ must be instantaneously equal to the ripple power, Equation (9) must be satisfied.

$$v_{CS} i_{CS} = C_s \frac{dv_{CS}^2}{dt} = P_R \sin(2\omega t + \varphi) \quad (9)$$

Integrating Equation (9) to solve for $v_{CS}$ gives $$|v_{CS}| = \sqrt{\frac{P_R}{C_s \omega}[k - \cos(2\omega t + \varphi)]} \quad (k \geq 1) \quad (10)$$

where k is an integral constant that determines the shape of the capacitor voltage waveform.

It should be highlighted that the polarity of $v_{CS}$ in Equation (10) can be either positive, negative or both, depending on the circuit topology of the RP to which $C_s$ is connected. A DC/DC type RP normally provides $C_s$ with a single polarity voltage waveform, whereas an inverter type could offer a dual polarity operation. If the operational waveform of $v_{CS}$ is positive, then $$v_{CS} = \sqrt{\frac{P_R}{C_s \omega}[k - \cos(2\omega t + \varphi)]} \quad (11)$$

and the associated capacitor current $i_{cs}$ will be given as $$i_{CS} = \frac{\sin(2\omega t + \varphi)}{\sqrt{\frac{1}{C_s P_R \omega}[k - \cos(2\omega t + \varphi)]}}. \quad (12)$$

Figure 6:
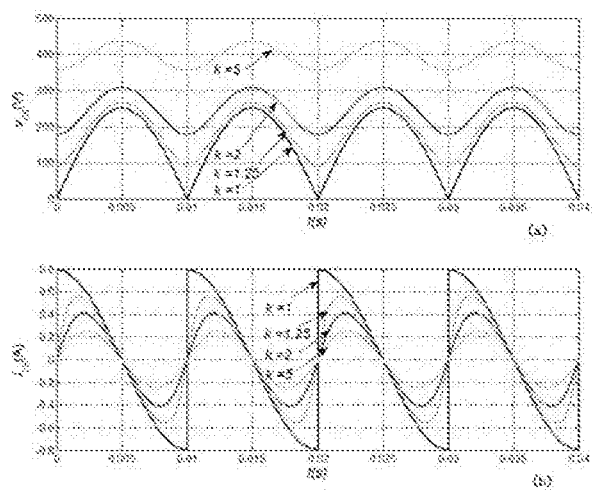
FIG. 6 shows waveforms of $C_s$ for different values of k. where

In order to help visualize the operation waveforms of $C_s$, FIG. 6 shows plots of voltage and current based on Equations (11) and (12) in which a ripple power $P_R$ of 100 W and $C_s$ of 10 μF are assumed with k=1, 1.25, 2, and 5. From FIG. 6, the following observations can be obtained:

(a) The DC (averaged) value of $v_{CS}$ increases as k increases.

(b) The voltage fluctuation of $v_{CS}$ decreases as k increases.

(c) When k=1, the shape of $v_{CS}$ has a rectified sinusoidal shape; as k increases, the waveform becomes more sinusoidal.

Alternatively, Equation (11) can be rearranged into $$v_{CS} = \sqrt{\frac{P_R}{C_s \omega}\left[(k-1) + 2\sin^2\left(\omega t + \frac{\varphi}{2}\right)\right]} \quad (13)$$

or $$v_{CS} = \sqrt{\frac{P_R}{C_s \omega}\left[\left(\sqrt{k} - \frac{1}{2\sqrt{k}}\cos(2\omega t + \varphi)\right)^2 - \frac{1}{4k}\cos^2(2\omega t + \varphi)\right]}. \quad (14)$$

According to Equation (13), when k=1, $v_{cs}$ can be simplified as $$v_{CS} = \sqrt{\frac{2P_R}{C_s \omega}} \left|\sin\left(\omega t + \frac{\varphi}{2}\right)\right| \quad (15)$$

which is clearly in the form of a rectified sinusoid and is in agreement with that plotted in FIG. 6. On the other hand, when k>>1, the $\cos^2(2\omega t + \varphi)$ term in Equation (14) can be neglected. Consequently, $V_{cs}$ can be approximated by a double-line frequency component with a DC offset, as shown in Equation (16).

$$v_{CS} = \overset{DC}{\sqrt{\frac{P_R k}{C_s \omega}}} - \overset{2\omega}{\sqrt{\frac{P_R}{4C_s \omega k}} \cos(2\omega t + \varphi)} \quad (16)$$

From Equation (16), it is clear that the DC component in $V_{CS}$ is proportional to the parameter k, while the amplitude of the double-line frequency content (i.e. the voltage ripple) is inversely proportional to k.

Figure 7:
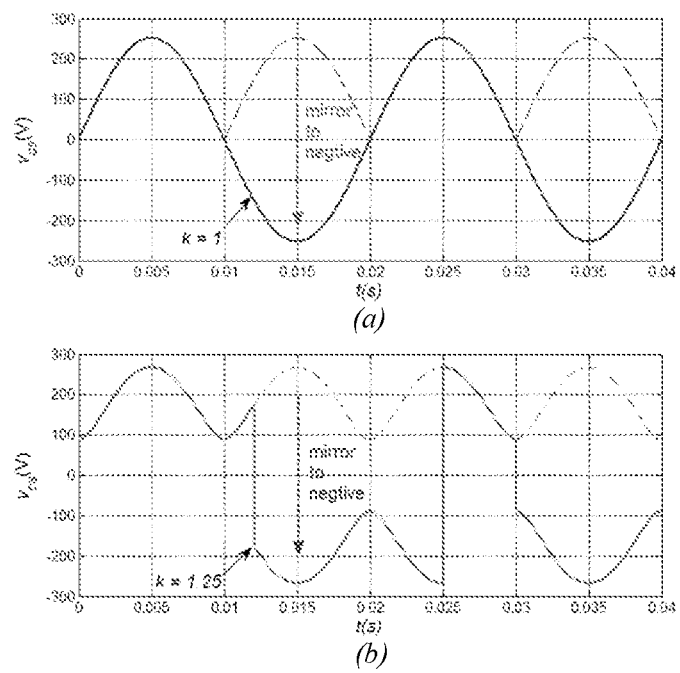
FIG. 7 shows voltage waveforms of Cs with inverter type RP where

In cases where the RP is of the inverter type, of which $V_{CS}$ is of dual polarity, the waveform of $V_{CS}$ can be much more diverse. By mirroring any portion of the $V_{CS}$ waveforms in FIG. 6 to negative, an AC waveform $v_{cs}$ can be derived. FIG. 7 shows two examples of how AC waveforms of $V_{cs}$ for k=1 and 1.25 can be obtained. Particularly, when k=1, $$v_{cs} = \sqrt{\frac{2P_R}{C_s \omega}} \sin\left(\omega t + \frac{\varphi}{2}\right), \quad (17)$$

which is a pure sinusoidal waveform with the line frequency.

The derived voltage waveforms are all theoretically valid, but some might be unsuitable for practical implementation. For instance, the rectified sinusoidal waveform shown in Equation (15) has severe voltage variations and abrupt changes at some periodic points, implying a rich content of harmonics. These kinds of waveforms are challenging for implementation with the RP. In contrast, the waveforms in Equations (16) and (17) contain only a single low-frequency content, which is much easier to track.

From Equation (11), the maximum and minimum voltage of $V_{CS}$ can be derived as $$V_{CS\_max} = \sqrt{\frac{P_R(k+1)}{C_s \omega}} \quad (18)$$

$$V_{CS\_min} = \sqrt{\frac{P_R(k-1)}{C_s \omega}} \quad (19)$$

and the respective energy stored in the storage capacitor $C_s$ is $$E_{CS\_max} = \frac{P_R(k+1)}{2\omega} \quad (20)$$

$$E_{CS\_min} = \frac{P_R(k-1)}{2\omega}. \quad (21)$$

The energy utilization rate, $\eta_E$, which is defined as the ratio of the fluctuation of energy over the maximum stored energy, can be expressed as $$\eta_E = \frac{E_{CS\_max} - E_{CS\_min}}{E_{CS\_max}}. \quad (22)$$

By substituting Equations (20) and (21) into Equation (22), $\eta_E$ can be expressed in terms of k as $$\eta_E = \frac{2}{k+1} \quad (23)$$

Equation (23) shows that $\eta E$ is inversely-proportional to k.

In a similar manner, the capacitor voltage utilization rate $\eta V$ (or ripple factor), which is defined as the ratio of the voltage variation over the average DC voltage $V_{CS\_avg}$, can be derived as that given in Equations (24) and (25).

$$V_{CS\_avg} = \frac{1}{2}(V_{CS\_max} + V_{CS\_min}) \quad (24)$$

$$\eta_V = \frac{V_{CS\_max} - V_{CS\_min}}{V_{CS\_avg}} = 2\left(k - \sqrt{k^2 - 1}\right) \quad (25)$$

Figure 8:
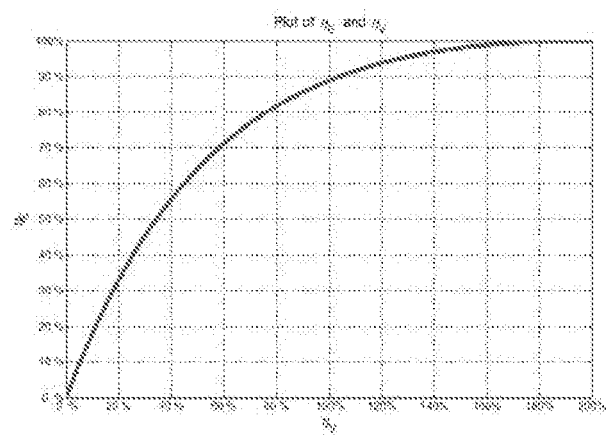
FIG. 8 is a plot of the relationship between voltage utilization rate ηV and energy utilization rate ηE.

As a result, it is possible to correlate $\eta V$ and $\eta E$ by combining Equations (23) and (25), and eliminating k to give Equation (26), which is plotted as shown in FIG. 8.

It should be noted that the maximum values for $\eta V$ and $\eta E$ are 200% and 100%, respectively.

$$\eta_E = \frac{8\eta_V}{\eta_V^2 + 4\eta_V + 4} \quad (26)$$

Equation (26) is useful for evaluating the utilization of the energy storage component by using only the voltage ripple information. For example, in conventional boost PFC rectifiers, with a 1% voltage ripple ($\eta V=1\%$) on the DC-link, the energy utilization rate is merely 1.98%. This means that the remaining 98% of the energy stored in the capacitor is redundant. For the proposed RP on the other hand, with a much larger voltage variation allowed on the Ccs, e.g. $\eta V=140\%$, the resulting utilization rate $\eta E$ is more than 96%. Clearly, the active energy storage method of the RP provides a significant improvement in terms of energy usage.

The topology of the RP could be selected as a DC/DC converter or a DC/AC inverter in accordance with the capacitor waveforms that have been derived in FIG. 6 (for DC operation) and FIG. 7 (for AC operation). As an illustrative example, only the DC/DC type converters are considered. These converters might or might not have galvanic isolation. Converters such as switched-capacitor (SC) converters are also possible candidates. See the M. Chen article, which is incorporated herein by reference in its entirety. In general, the three rules in determining the circuit topology for the RP are:

(d) Energy utilization rate $\eta_E$ should be large.
(e) The size and cost of the energy storage capacitor should be small.
(f) High voltage stress on components should be avoided.

According to FIG. 8, the allowance of a higher $\eta_V$ (bigger voltage swing over $C_s$) results in a higher $\eta_E$. However, a high $\eta_E$ does not necessarily guarantee a very small capacitance. By combining Equations (19), (20), (25), and (26), $C_s$ can be derived as $$C_s = \frac{P_r}{\omega V_{CS\_avg}^2 + \eta_V}. \quad (27)$$

From Equation (27), it can be understood that to minimize the energy storage capacitance, both $\eta V$ and VCS_avg (i.e., average voltage of Cs) should be large.

For AC/DC systems with a high DC port voltage $V_{DC}$, such as that in typical boost PFC rectifiers with a 400 V DC-link output, a buck or a buck-boost converter can be used. Both converters can realize 100% energy utilization rate since the voltage of Cs can be fully discharged to zero. Nevertheless, the $V_{CS\_avg}$ in a buck converter is bounded by $V_{DC}$, whereas it can be much higher in a buck-boost converter. Hence a smaller capacitance can be realized in a buck-boost converter at the cost of higher voltage stress. However, if a boost converter is used, Cs can only be discharged to $V_{DC}$. Therefore, Cs contains significant amount of redundant energy that cannot be utilized. Also, the voltage stress will be very high, which is unacceptable. These characteristics obviously violate the converter selection rules.

For AC/DC systems that have a low $V_{DC}$ (e.g. a microinverter system in which one or several low voltage PV cell are connected to an inverter), a buck-boost or a boost converter can be selected. Here, both the redundant energy and the voltage stress can be low for the boost converter because of the low $V_{DC}$. The buck converter is not chosen since the upper limit of $v_{CS}$ is bounded by the low $V_{DC}$, resulting in a low $V_{CS\_avg}$ value. A large capacitor would have to be applied with the buck RP, which is undesirable.

Figure 9:
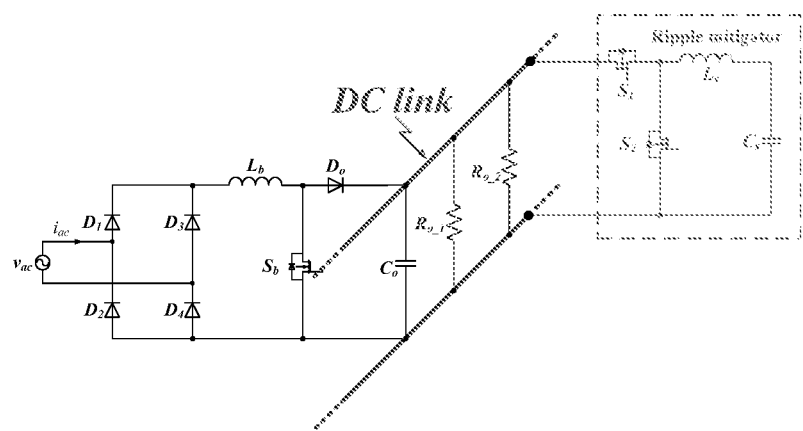
FIG. 9 is a schematic of a system comprising a boost PFC rectifier and an RP being connected to the DC-link.

For purposes of understanding the present invention a system with a high DC-link voltage of 400 V is considered. Therefore, a bi-directional buck converter is selected as the RP. FIG. 9 shows the circuit arrangement of a boost PFC rectifier and an RP being connected to the DC-link.

Figure 1:
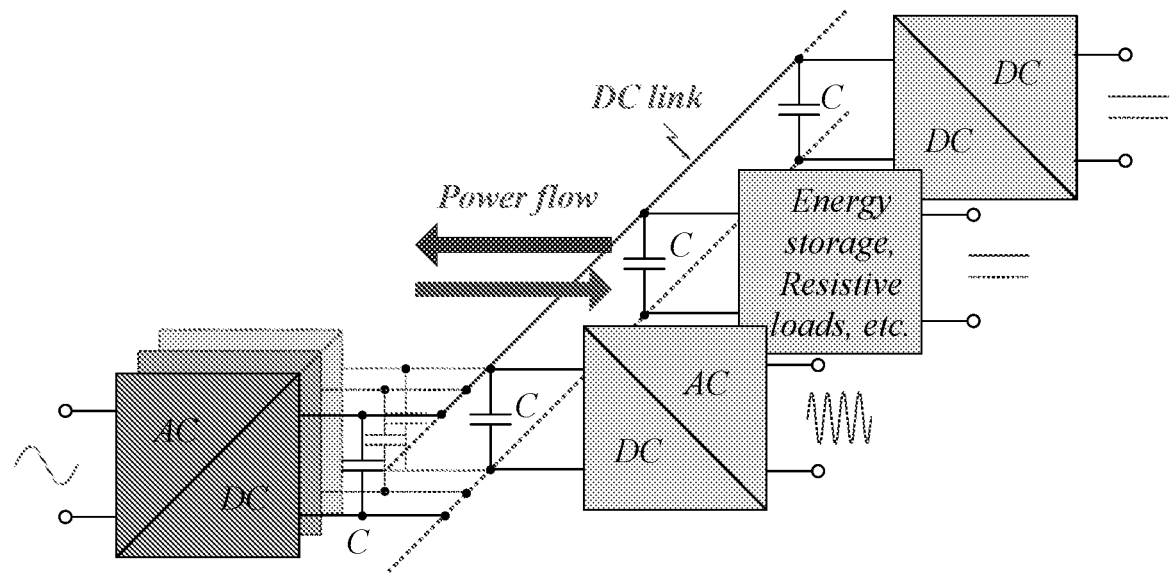
FIG. 1 is a block diagram of a typical power stage infrastructure for power electronics system with a DC-link.
Figure 2:
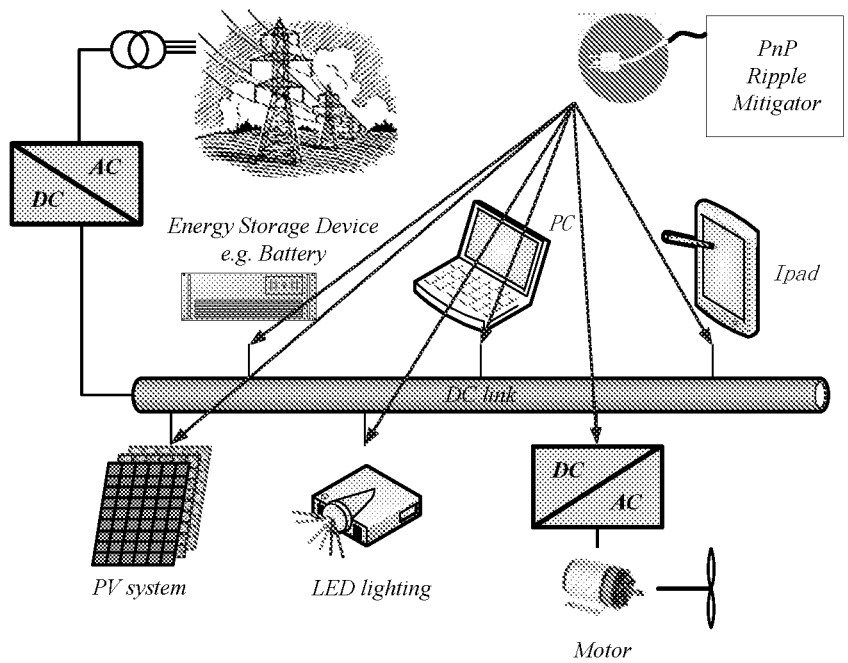
FIG. 2 is an overview of an existing DC-link (DC utilities and systems) with multiple plug-and-play ripple power devices according to the present invention installed therein.

In order for the RP to operate effectively, the active filter must be controlled. Generally, there are four methods to control the active filter:

(1) Directly control the output current of the shunt active filter $i_f$ such that $i_s - i_f = I_{DC}$, where $I_{DC}$ is a constant DC current. Therefore, $i_f$ can be controlled to be equal to the ripple content in $i_s$, as illustrated in FIG. 2;

(2) Directly control the instantaneous power in the energy storage device such that the ripple power generated by the AC/DC converter is compensated. Typically, the control of the instantaneous power is achieved by regulating the voltage/current of the energy storage device. This method is equivalent to the first; however, the output current $i_f$ is indirectly controlled;

(3) Directly calculate the duty cycle based on the ripple current content in $i_s$. This method is a feedforward control; and (4) Directly regulate the instantaneous DC voltage through feedback control. It is a DC-voltage based control.

The control design is critical for the actualization of the plug-and-play operation of the RP. First, the controller must be DC port based; meaning that the only information available for performing the control is the DC output voltage $V_{DC}$. Currently, many existing methods for controlling active filters are circuit-model based (e.g. by using Equation (6)) that require knowledge of the AC side information (such as current and voltage) and the system parameters. These methods require installation of extra sensors into the existing host system and are invasive to its operations. This makes them inappropriate for RP implementation. Furthermore, they are typically complicated and inaccurate. See the articles M. Su; et. al., H. Li, et al.; Y. Tang, et. al., and P. T. Krein and R. S. Balog, "Cost-effective hundred-year life for single-phase inverters and rectifiers in solar and LED lighting applications based on minimum capacitance requirements and a ripple power port," *IEEE Applied Power Electronics Conference and Exposition*, (2009), pp. 620-625].

Since the ripple voltage on the DC port is caused by the ripple power $p_r$, the ripple voltage alone contains sufficient information to predict the ripple power. For the present invention, a ripple-voltage based controller is proposed. It utilizes only the ripple voltage information on the DC port of the AC/DC system to estimate the voltage waveform $V_{CS}$ of the energy storage capacitor. No information from the AC side is needed, nor does it require knowledge of the exact system parameters.

Assume that a large k is adopted for both the DC-link voltage $V_{DC}$ and the energy storage capacitor $V_{CS}$. According to Equation (16), both waveforms can be approximated as functions that comprise a double-line frequency ripple and a DC offset, in which the ripple of both functions are in phase. An ideal proportional-resonant (PR) controller, which has an infinite gain at the double-line frequency, can be used to ensure that $V_{CS}$ is controlled to fully mitigate the double-frequency ripple of $V_{DC}$. An example of such a controller shown in D. N. Zmood and D. G. Holmes, "Stationary frame current regulation of PWM inverters with zero steady-state error," *IEEE Trans. Power Electron.*, vol. 18, no. 3, pp. 814-822, May 2003, which is incorporated herein by reference in its entirety. When the energy utilization rate $\eta_E$ is high, k for $V_{CS}$ is designed to be low. In this case, the high-order harmonic contents of $V_{CS}$ increase, and the control of $V_{CS}$ using a single PR controller will be inaccurate. Instead, a multi-PR controller that has high gain for multiple selected frequencies and over a wider bandwidth can be applied. As an example, see the M. Su, et al. article and R. Teodorescu, et al., "A new control structure for grid-connected LCL PV inverters with zero steady-state error and selective harmonic compensation," *IEEE Applied Power Electronics Conference and Exposition*, (2004), vol. 1, pp. 580-586, which is incorporated herein by reference in its entirety.

A repetitive controller is also an alternative solution. See M. Steinbuch, "Repetitive control for systems with uncertain period-time," *Automatica*, vol. 38, no. 12, pp. 2103-2109, (December 2002), which is incorporated herein by reference in its entirety.

The transfer functions for an ideal PR, multi-PR and repetitive controller are shown in Equations (28)-(30), respectively.

$$G_{c\_PR} = k_p + \frac{k_i s}{s^2 + \omega_1^2} \tag{28}$$

$$G_{c\_PR\_multiple} = k_p + \frac{k_{i1} s}{s^2 + \omega_1^2} + \frac{k_{i2} s}{s^2 + \omega_2^2} + \frac{k_{i3} s}{s^2 + \omega_3^2} + \ldots \tag{29}$$

$$G_{c\_Rp} = e^{-\frac{2\pi}{\omega_1} s} \tag{30}$$

Ideal PR controllers are mostly impractical. Instead, the quasi-PR controller, which is more easily realized through simple analog circuits or microprocessors, is typically adopted in implementation. See the articles H. Li, et al. and D. N. Zmood, et al., which are incorporated herein by reference in their entireties. A typical transfer function for a quasi-PR controller is shown in Equation (31), where $\omega_c$ is the cut-off frequency and $\omega_1$ is the resonant frequency.

$$G_{c\_quasi\_PR} = k_p + \frac{k_i \omega_c s}{s^2 + \omega_c s + \omega_1^2} \tag{31}$$

The gain of the quasi-PR controller is lower than that of the ideal PR controller, but it has a wider passband. Therefore, in terms of mitigating ripples in systems that have a shifting line-frequency as in real-life AC grids, the quasi-PR controller would be more useful.

The buck RP is operated to provide for bi-directional power flow. It can be perceived as a buck converter when power flows in the direction from $V_{DC}$ to $C_s$, or as a boost converter when power flows reversely. The control of the RP is individually examined for both directions of power flow. While it may first appear that the controller is different for both cases, in fact they are equivalent when it comes to implementation. As the AC/DC system model used in this work is general, the conclusion made is universal to all possible AC/DC systems.

Figure 10:
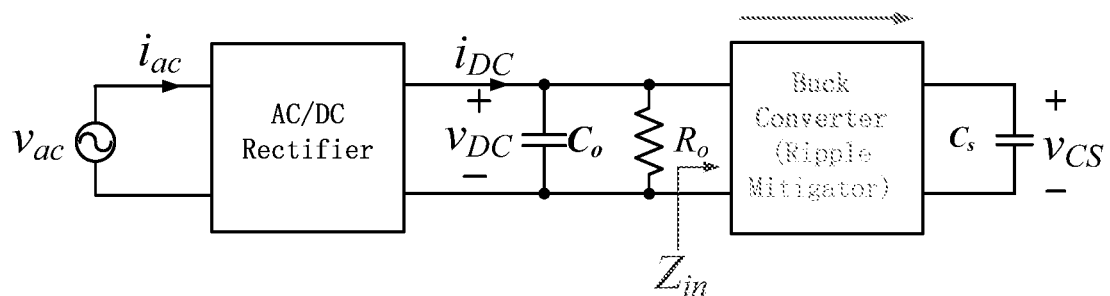
FIG. 10(a) is a block diagram of a circuit configuration of an AC/DC system with a bi-directional buck converter as the RP.
FIG. 10(b) is a circuit schematic of the arrangement of FIG. 10(a)
Figure 10:
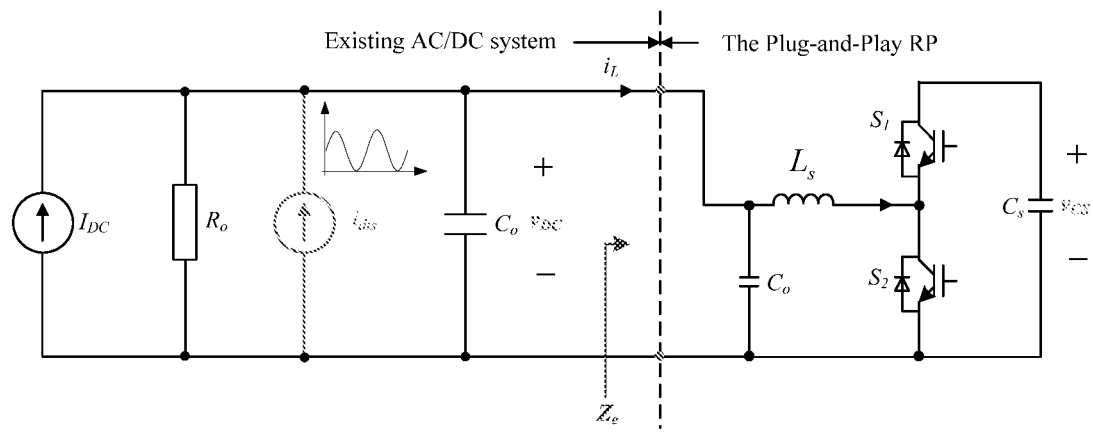

For power flowing from the DC port of the AC/DC system to the energy storage capacitor Cs, the RP operates as a buck converter, as illustrated in FIG. 10.

Figure 11:
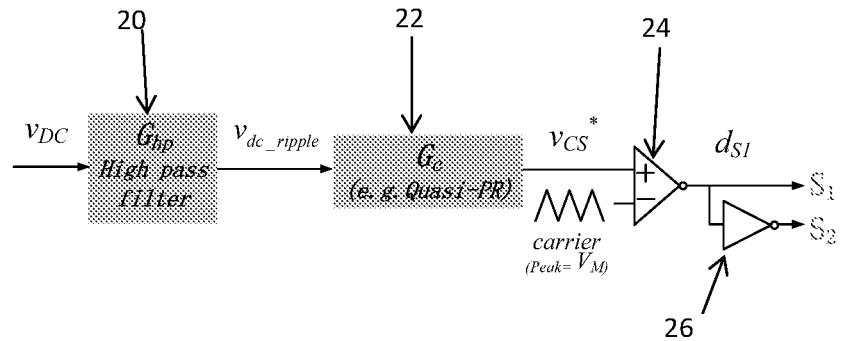
FIG. 11 is a control block of the RP when controlled as a buck converter.

A possible control block of the RP is illustrated in FIG. 11, which shows a high-pass filtered DC-link voltage being processed by the quasi-PR controller 22 with transfer function $G_C$, and generating a reference capacitor voltage $V_{CS}^*$. The high-pass filter 20 removes the DC content of $V_{DC}$. For control simplicity, $V_{CS}^*$ is directly pulse-width-modulated by a carrier signal $V_m$ applied to comparator 24, which also receives $V_{cs}$ to control the buck converter without the sensing and closed-loop feedback of the actual $V_{CS}$. Essentially, this is a feed-forward control. Here, the high-side switch $S_1$ is directly controlled by the controller, while the low-side switch $S_2$ is made complimentary to $S_1$ by inverter 26. The overall open-loop transfer function from DC-link voltage to the output duty cycle $d_{S1}$ is $$G_{op(S1)} = \frac{\hat{d}_{S1}}{\hat{v}_{DC}} = G_{hp} G_c / V_M \tag{32}$$

where $G_{hp}$ is the transfer function of the high-pass filter and $V_M$ is the modulator amplitude.

Figure 12:
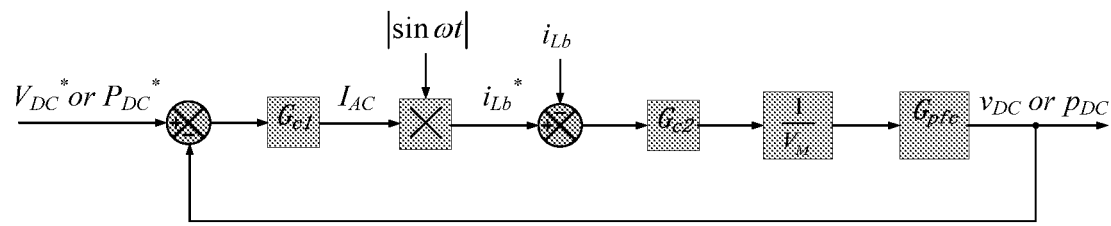
FIG. 12 is a typical control block diagram of a boost PFC rectifier.
Figure 13:
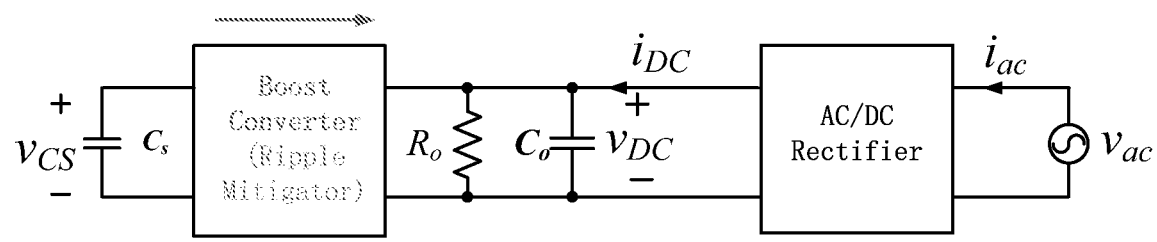
FIG. 13 is a circuit configuration of an AC/DC system when the RP operates as a boost converter.
Figure 14:
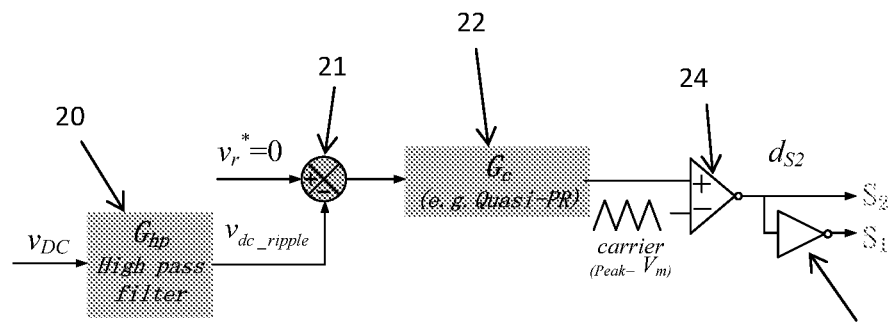
FIG. 14 is a control block of the RP when controlled as a boost converter.
Figure 15:
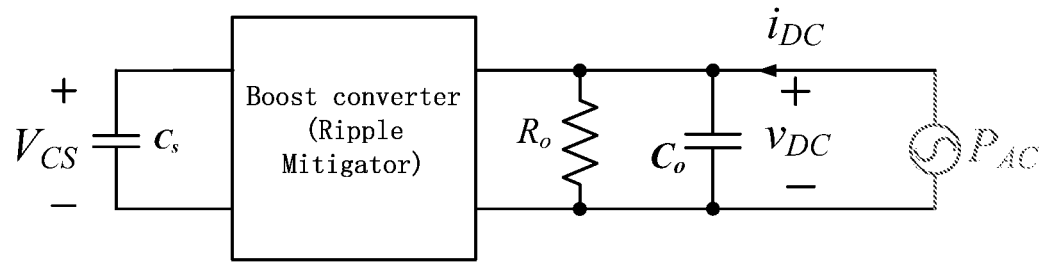
FIG. 15 is an equivalent state-space averaged circuit model of RP with consideration to the AC/DC input source.
Figure 16:
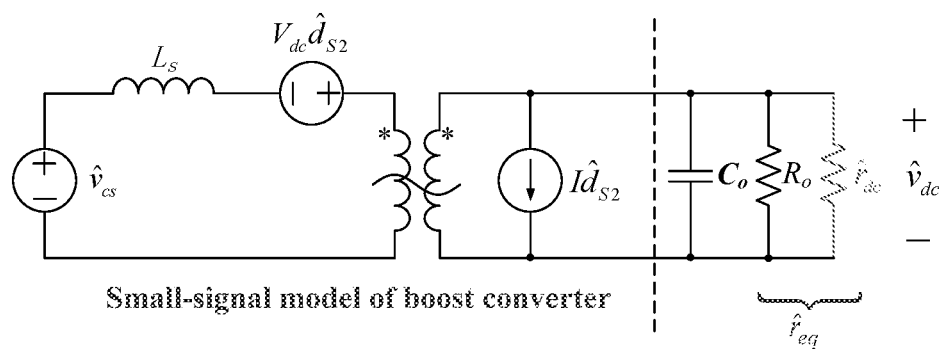
FIG. 16 is a small-signal model of RP with consideration to the AC/DC input source.

FIG. 12 shows the typical control block diagram of a boost PFC rectifier with input current shaping control. Generally, the bandwidth of the outer voltage/power loop of the PFC controller is very small (e.g. lower than a few Hz) and only the DC voltage/power ($V_{DC}$ or $P_{DC}$) of the DC-link is regulated. At steady state, the ripple power which the RP absorbs is an AC double-line frequency component, and the RP consumes no DC power. If the input impedance of the RP is defined as $Z_{in}$, as shown in FIG. 10(a), the ideal $Z_{in}$ would be $$\begin{cases} Z_{in\_DC} = \infty \\ Z_{in\_2\omega} = 0 \end{cases} \qquad (33)$$

where $Z_{in\_DC}$ and $Z_{in\_2\omega}$ are the input impedance $Z_{in}$ corresponding to DC and double-line frequency voltage signals, respectively. This means that the incorporation of the RP on the DC port has no influence on the average DC voltage control of the original AC/DC system.

For verification, an experimental simulation was performed using PSIM software based on the circuit configuration shown in FIG. 9, where a boost PFC rectifier is used as the AC/DC conversion system. Two isolated resistive loads $R_{o\_1}$ and $R_{o\_2}$ are used to emulate the two different utilities connected on the DC-link. The key circuit parameters are given in Table I.

TABLE I

KEY CIRCUIT PARAMETERS FOR SIMULATION AND EXPERIMENT

| Plug-and-Play RP Parameters | Values | Boost PFC stage Parameters | Values |
|---|---|---|---|
| Input voltage $V_{DC}$ (V) | 400 | Nominal power $P_{DC}$ (W) | 100 |
| Energy storage capacitor $C_s$ (μF) | 5 | AC voltage $v_{ac}$ (V) | 220 |
|  |  | Output voltage $V_{DC}$ (V) | 400 |
| Inductor $L_s$ (mH) | 2.5 | Dc-link capacitor $C_o$ (μF) | 5 |
| Switching frequency $f_{s1}$ (kHz) | 25 | ESR of $C_o$ @ 400 V (Ω) | 3.51 |
|  |  | Boost inductor $L_b$ (μH) | 390 |
|  |  | Load 1: $R_{o\_1}$ (Ω) | 2400 |
|  |  | Load 2: $R_{o\_2}$ (Ω) | 4800 |
|  |  | Switching frequency $f_{s2}$ (kHz) | 100 |

Figure 20:
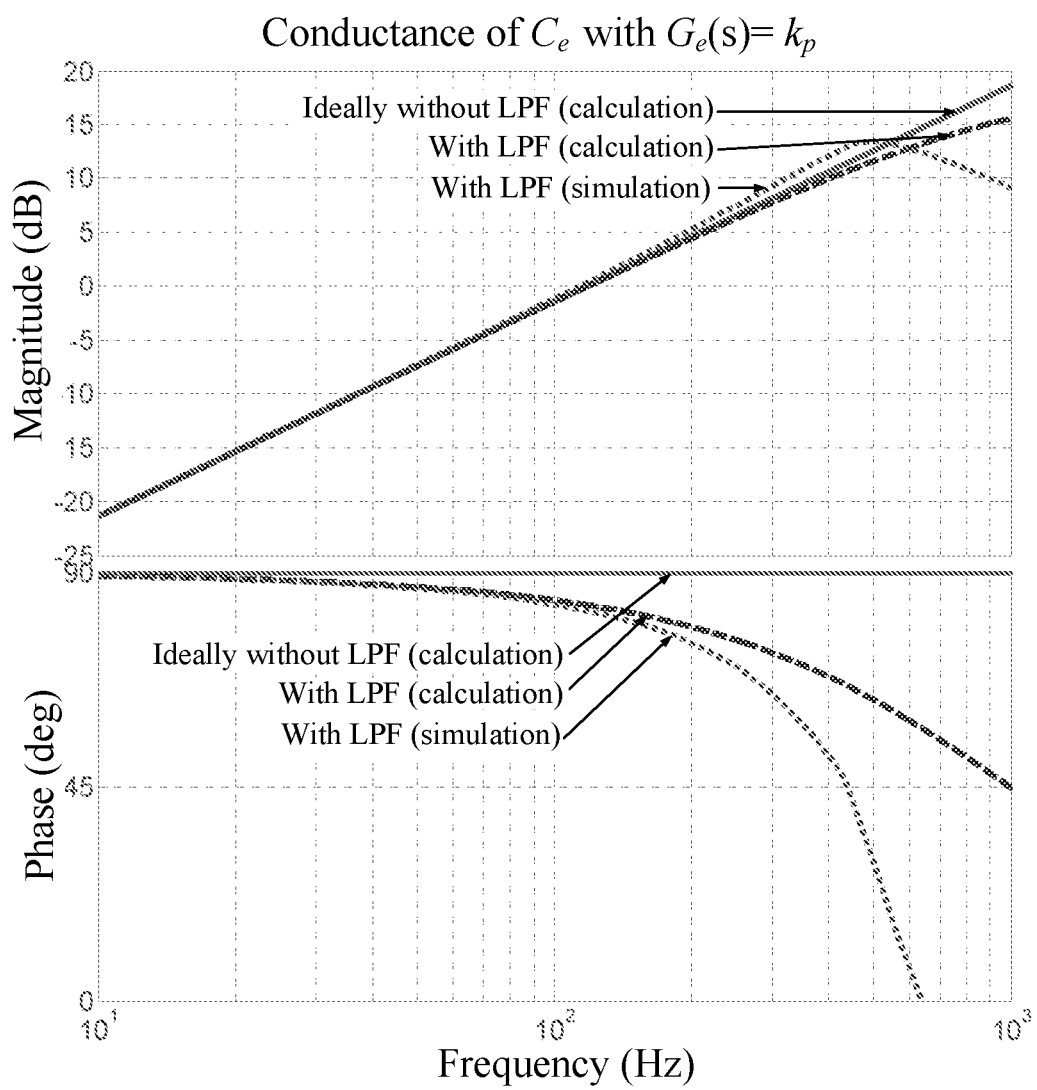
FIG. 20 is a simulation of results of the steady-state operation waveforms of the system where

FIG. 20 shows the simulation results of the steady-state voltage waveforms of the DC-link and the energy storage capacitor. Before the RP is applied (FIG. 20(*a*)), the DC-link voltage ripple is more than 60.9 V, which accounts for 15.2% of the average value (400 V). The large ripple is due to the use of a small capacitor on the DC-link. After the RP is plugged-in (FIG. 20(*b*)), the voltage ripple is effectively reduced to around 7.2 V for the case of using the PR controller with 100 Hz resonant frequency and to around 3.9 V (<1% of the averaged DC-link voltage) when a multi-PR controller is utilized, as shown in FIG. 20(*c*). The simulation results are in good agreement with the experimental results that are shown in FIG. 21.

A schematic of the block diagram of FIG. 10(*a*) is shown in FIG. 10(*b*). It illustrates the use of the plug-&-play device programmed as an emulated capacitor and used as a voltage ripple pacifier in the system. As part of a simulation a current source ($i_{dis}$) is included in the system to disturb the 48V dc link voltage by creating repetitive voltage ripple. The current source is programmed to inject current into the system at four different frequencies (30 Hz, 100 Hz, 200 Hz and 300 Hz) in order to create voltage ripples at these four frequencies. Separate simulation tests are conducted with and without the proposed voltage ripple pacifier. The voltage ripple pacifier is programmed with an emulated capacitor of C'=520 μF, although the actual $C_o$=10 μF and $C_s$=20 μF. For the simulation without using the voltage ripple pacifier, a capacitor of 520 μF is used so that the results can be compared with those obtained with the emulated capacitor (with an equivalent capacitance of 520 μF).

Figure 21:
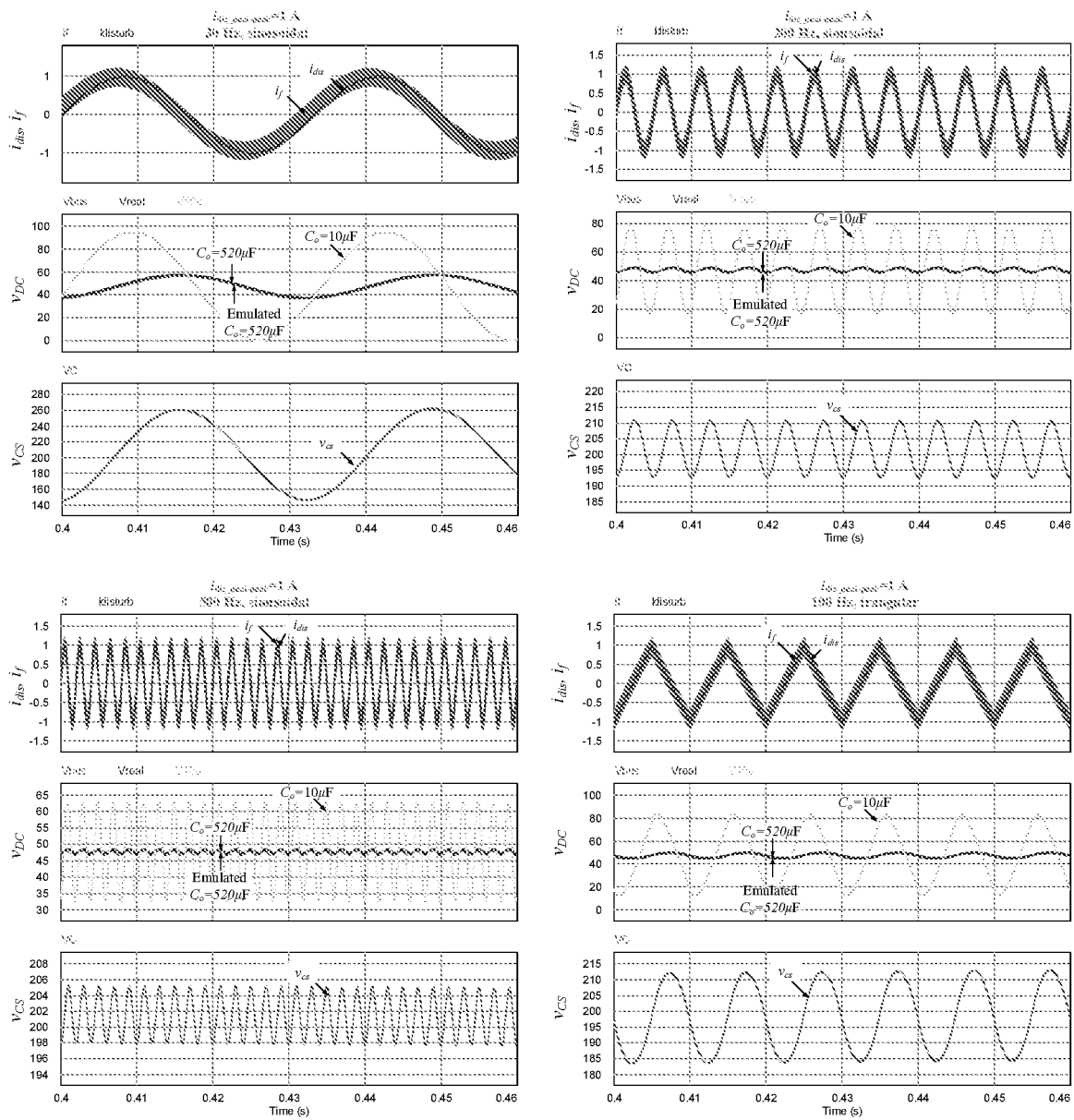
FIG. 21 shows graphs of experimental results of the steady-state operation waveforms and FFT results of the DC-link voltage for the circuit of FIG. 10(b)
Figure 22A:
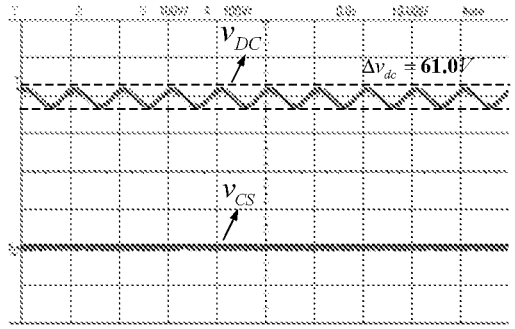
Figure 22B:
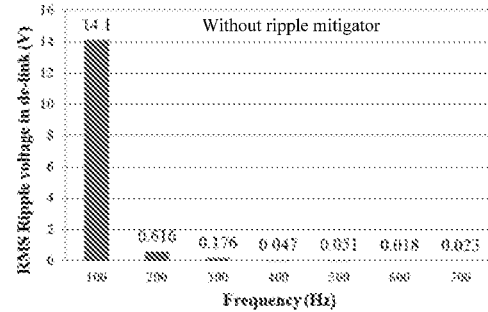
Figure 22C:
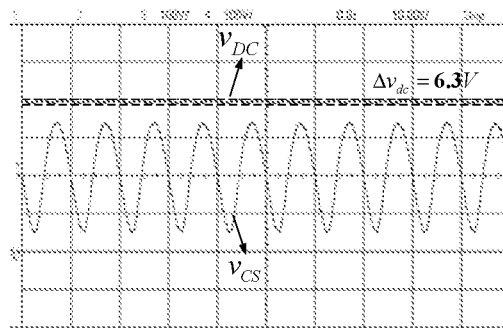
FIGS. 22(c), 22(d) with RP using PR controller of 100 Hz resonant frequency.
Figure 22D:
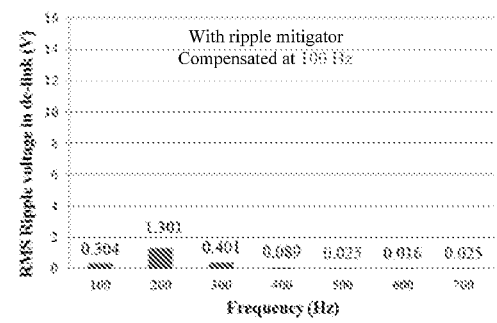
Figure 22E:
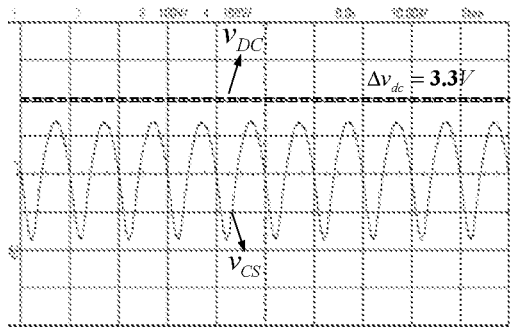
Figure 22F:
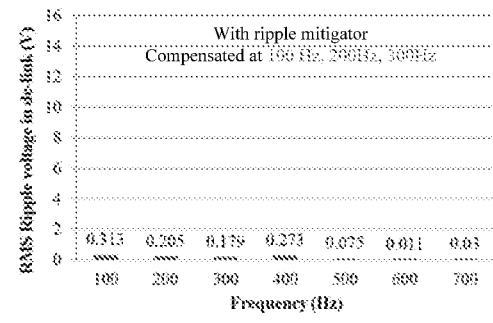

The simulation results are shown in FIG. 21. Comparisons of the DC-bus voltage $V_{DC}$ are given for scenarios when
(a) a DC-bus capacitor $C_o$=10 μF is used only.
(b) a DC-bus capacitor $C_o$=520 μF is used only
(c) the Ripple Pacifier emulating a capacitor C'=520 μF (with $C_o$=10 μF and $C_s$=20 μF)
The simulations results show that the filtering effect of the emulated capacitor of 520 μF (provided by the shunt voltage ripple pacifier) in reducing the voltage ripple is as effective as a practice capacitor of 520 μF. The magnitude of the filtered voltage ripples is significantly smaller than that when only a small capacitor of $C_o$=10 μF is used.

According to FIG. 22, with an RP using a PR controller of 100 Hz resonant frequency, the DC-link voltage ripple is significantly mitigated from 61 V (see FIG. 22(*a*)) down to 6.3 V (see FIG. 22(*c*)). The fast Fourier transfer (FFT) analysis of $V_{DC}$ shows that the RMS value of the double-line frequency ripple is reduced from 14.1 V (see FIG. 22(*b*)) down to 0.304 V (see FIG. 22(*d*)). With a high voltage utilization rate, $V_{DC}$ still contains noticeable high-order ripple contents, as indicated in FIG. 22(*d*). The performance of the DC-link voltage can be further improved with a ripple of only 3.3 V (see FIG. 22(*e*)) when the controller of the RP is changed to a multi-PR controller with resonant frequencies of 100 Hz, 200 Hz, and 300 Hz. This is clearly reflected in FIG. 22(*f*) which shows the high-order ripples being effectively suppressed.

Figure 23A:
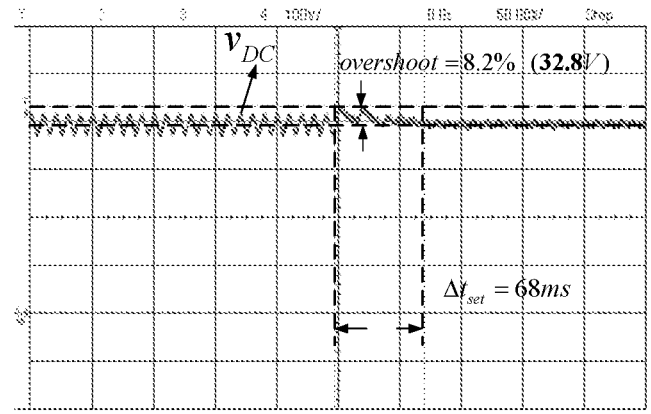
FIGS. 23(a) and 23(b) are transient voltage waveforms of the system from full load to 20% load without RP (left) and with RP (right)
Figure 23B:
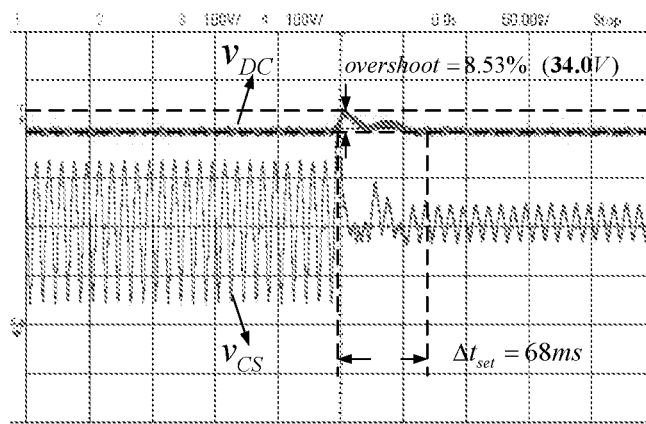
Figure 24A:
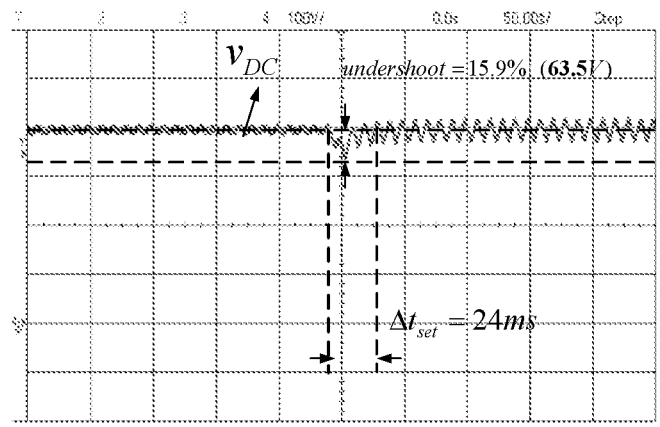
FIGS. 24(a) and 24(b) are transient voltage waveforms of the system from 20% load to full load without RP (left) and with RP (right)
Figure 24B:
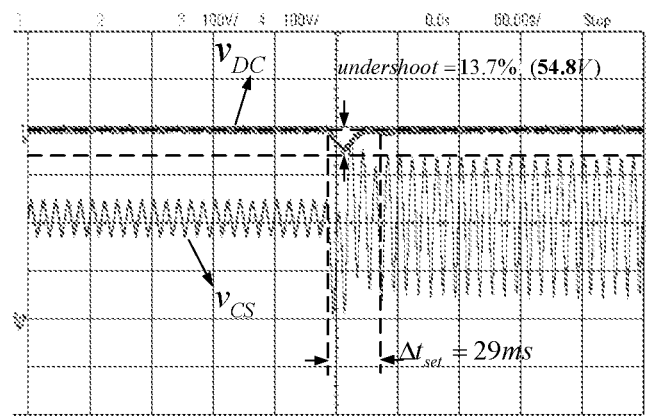

Four sets of step-load change experiments were conducted (from full load to 20% load, and from 20% load to full load) with and without the use of RP. These experiments were conducted to examine the transient and steady state performance of the RP. The transient voltage waveforms of the DC-link and the energy storage capacitor are shown in FIG. 23 and FIG. 24. In particular, FIGS. 23(*a*) and 23(*b*) are transient voltage waveforms of the system from full load to 20% load without RP (left) and with RP (right) in each figure. FIGS. 24(*a*) and 24(*b*) are transient voltage waveforms of the system from 20% load to full load without RP (left) and with RP (right) in each figure.

From the results, it is observed that for both load-change conditions, the DC-link voltage of the system is of similar dynamics in terms of their overshoot/undershoot ratio and settling time, for both cases with and without the RP. Note that with the RP, there is no change in the steady-state DC-link voltage before and after the load transient. This demonstrates the non-invasive property of the proposed RP on the normal functioning of the existing system. Moreover, with the RP, the double-line frequency ripple is mitigated even during the transient intervals, which clearly showcases its fast dynamic capability in mitigating the ripple.

The power consumed by the RP is also examined. Ideally, the RP absorbs only the ripple energy and does not consume power. In practice, however, the RP device has power losses and requires power supplies for its driver and control ICs. Notably, the core loss and copper loss of the inductor $L_s$ is low, since the inductor current for $L_s$ is slowly varying with double the line frequency, and its averaged value is zero. FIG. 25 shows the relative power consumed by the RP against the output power of the AC/DC system ranging from 20 W to 110 W. A maximum value of 5.4% is recorded at light load, while this number decreases to less than 2% at medium and full load.

Since the energy consumed by the RP is from the DC-link, the RP does contribute to efficiency degradation of the AC/DC system. However, the drop of the overall efficiency is insignificant since the ripple power is processed by the film cap Cs that has a low equivalent series resistance (ESR) (when used with RP) instead of the original E-Cap Co that high a high ESR (without RP) as clearly illustrated in the efficiency plots shown in FIG. 25. For the entire power range, the difference in efficiency is small, especially at high power levels. For instance at Po=110 W, the RP causes a 1.34% drop of efficiency.

The RP has an impact in reducing the operational temperature of the components in the main boost PFC rectifier. With the RP, the low-frequency ripple current that flows through the output capacitor Co is reduced, leading to a lower junction temperature of the pre-installed E-Cap. This prolongs the lifetime of the E-Cap. Moreover, by ensuring a constant and ripple-free DC-link voltage, the power losses of all power devices and magnetics of the AC/DC power converters and connected downstream converters is diminished.

FIG. 26 shows the experimentally-captured thermal image of the boost PFC rectifier taken after three hours of operation under free convection with an ambient temperature of 25.4° C., for both with and without the use of RP. In FIG. 26 point a is a plastic cover of an E-Cap Co; point b is an aluminum top cover of E-Cap Co; point c is an output diode Do; point d is a power MOSFET Sb; point e is an input diode bridge D1~D4; and point f is a magnetic core of boost inductor Lb. The thermal image is captured using NEC-TH5100 with an emission rate of 0.95. The actual surface temperatures of the respective components are also measured using thermal couplers and a FLUKE data acquisition unit, and are shown in Table II.

TABLE II

MEASURED TEMPERATURE WITH AND WITHOUT RP

| Measured Surface | Without RP (° C.) | With RP (° C.) | Temperature reduction ΔT (° C.) |
| --- | --- | --- | --- |
| Point a : plastic cover of E-Cap $C_o$ | 42.5 | 35.0 | 7.5 |
| Point b: aluminum top of E-Cap $C_o$ | 42.2 | 34.1 | 8.1 |
| Point c: output diode $D_o$ | 50.7 | 41.4 | 9.3 |
| Point d: power MOSFET $S_b$ | 42.4 | 33.9 | 8.5 |
| Point e: input diode bridge $D_1$~$D_4$ | 60.0 | 52.3 | 7.7 |
| Point f: magnetic core of $L_b$ | 64.7 | 54.3 | 10.4 |

As expected, when the RP is activated, all power devices, the magnetics, and the E-Cap, have a much lower temperature. All components gain a surface (junction) temperature reduction of more than 7.5° C. Since the operational lifetime of components, especially the power semiconductors and the E-caps, are highly dependent on the junction temperature, the results achievable with the RP given in FIG. 26 are significant considering the large improvement in the overall system reliability. For instance, the expected operational lifetime of an E-Cap is modeled in S. K. Maddula and J. C. Balda, "Lifetime of electrolytic capacitors in regenerative induction motor drives," *IEEE Power Electronics Specialists Conference*, (2005), pp. 153-159; and S. G. Parler, "Application guide, aluminum electrolytic capacitors." [Online]. Available: www.cornell-dubilier.com], as $$L = L_B M_V 2^{\frac{(T_M - T_j)}{10}} \quad (34)$$

where L is the expected lifetime of the capacitor in hours, $L_B$ is the base lifetime at the maximum permitted junction temperature $T_M$, $M_V$ is a unit-less voltage multiplier for voltage de-rating, and $T_j$ is the junction temperature of the capacitor. According to Table II, the reduction of surface temperature at Point b with the use of RP is 8.1° C., which by using Equation (34), translates into a 1.75 times boost of the E-Cap's lifetime. Since the E-Cap adopted in the experiment is one that already has a low ESR (see Table I) and a relatively long lifetime, the 1.75 times boost of the lifetime by the RP will be significant for achieving high reliability of such systems.

Figure 27:
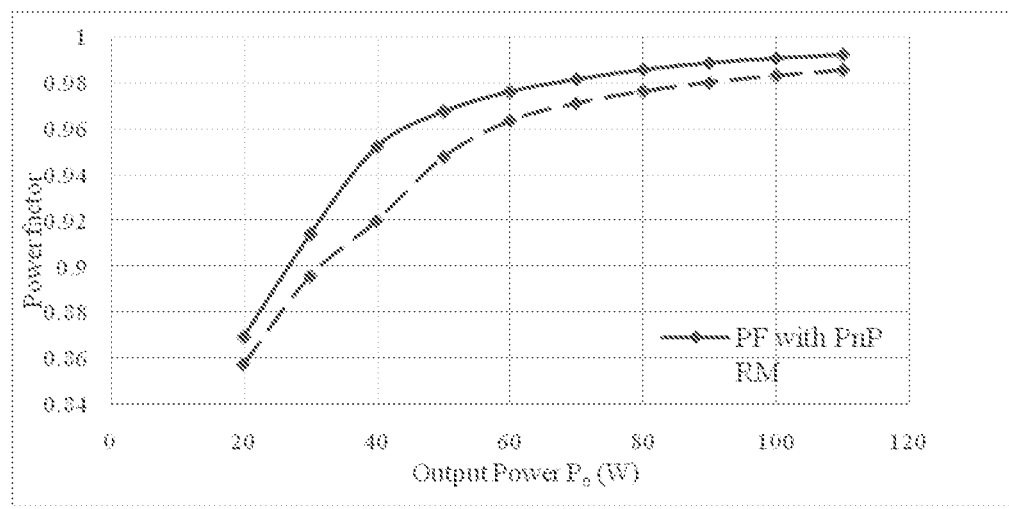
FIG. 27 is a plot of power factor against output power of the AC/DC system with and without the use of RP.

In FIG. 27, a comparison of the power factor of the AC/DC system with and without the RP is shown. It can be seen that, with the RP, the power factor is slightly improved. According to S. A. Khajehoddin, et al., "DC-bus design and control for a single-phase grid-connected renewable converter with a small energy storage component," *IEEE Trans. Power Electron.*, vol. 28, no. 7, pp. 3245-3254, (July 2013), the double-line frequency ripple on the DC-link can introduce third harmonics into the input current by disturbing the reference point of the current control in the AC/DC system. By mitigating this ripple content, the RP can indeed ameliorate the power factor performance of the AC/DC system.

According to the present invention, a plug-and-play Ripple Pacifier (RP) is proposed for stabilizing the DC-link interface of DC utilities and systems such as those involving AC/DC and DC/AC power electronic applications. The proposed RP is simple-to-use, of low cost, and is non-invasive to its host AC/DC systems. It is suitable for the protection of DC utilities/systems and can also be used as a direct replacement for ripple-canceling E-Caps in power converters. Theoretical and experimental work performed on a boost PFC rectification system validates the ripple-mitigation capability of the proposed device. The results show that significant mitigation of the DC-link ripple and significant reduction of operational temperature of the PFC rectifier is achievable with the RP.

The device of the present invention may be programmable. This means that the technical function of the device can be programmed with a specific function. It should be noted, however, that while the plug-&-play device can be a programmable one (such as changing a program of the control function and values of some components in a hardware circuit); it can also be designed specifically without the flexibility of using a programmable design.

Figure 17:
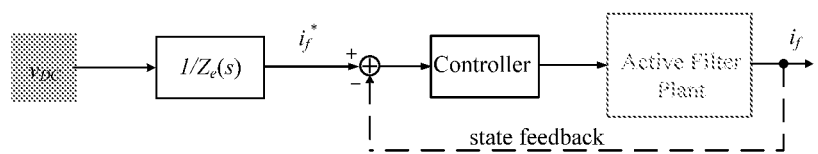
FIG. 17 is a control block diagram of the proposed DC-voltage based control for RP, showing how to emulate an impedance of $Z_e$.

The main concept of the invention is to control the plug-&-play device like an emulated impedance or function (Ze) as shown in FIG. 17. For example, such function can be that of a capacitor or an active power filter. If the device is designed as an emulated capacitor so that the plug-&-play device can behave like a voltage ripple pacifier (RP) and if Ze is controlled as a shunt equivalent capacitor, then the dc link voltage $V_{DC}$ can be well stabilized in scenarios when (a) the instantaneous power is imbalanced between the source and load (b) the instability occurs due to the un-matching impedance from the source and load (c) power dips caused by a sudden load increase.

Such a programmable impedance is realized by controlling the input current of the RP $i_f$ to follow $i_f^*$, a reference current that satisfies $$\tilde{i}_f^*(s) = \frac{\tilde{v}_{DC}(s)}{Z_e(s)}. \quad (35)$$

where the symbol "~" refers to small ac signals. Therefore, $\tilde{i}_f^*$ and $\tilde{v}_{DC}$ are the small perturbations of the reference filter current and the DC link voltage, respectively.

A general control block diagram is shown in FIG. 17. Note that the derivation of $i_f^*$ from $V_{DC}$ can be realized in various ways. In the example of emulating a capacitor of $C_e$, and hence $$\tilde{i}_f^*(s) = \frac{\tilde{v}_{DC}(s)}{Z_e(s)} = \frac{\tilde{v}_{DC}(s)}{1/(sC_e)}, \quad (36)$$

It can be obtained through an analogue differentiator circuit, according to Equation (36). This method has been proposed in X. Zhang et al., "Adaptive Active Capacitor Converter for Improving Stability of Cascaded DC Power Supply System," *IEEE Trans. Power Electron.*, vol. 28, no. 4, pp. 1807-1816, (April 2013), although it is used only for stabilizing an impedance-unmatched cascaded system. However, using a differentiator would lead to noise issues in electronic circuits. A better approach to obtain $i_f^*$, is shown in FIG. 18(a) for the shunt plug-&-play device. It uses a small impedance $C_o$ in parallel with the DC-bus, and then amplifies its current $i_{C_o}$ by K times for $i_{L1}$ to follow. In this way, the expected $i_f^*$ would be $$i_f^* = i_{C_o} + i_{L1} = i_{C_o} + Ki_{C_o} \approx Ki_{C_o}, \quad (37)$$

where K>>1 is assumed. Consequently, $Z_e$ would be $$Z_e(s) = \frac{\tilde{v}_{DC}(s)}{\tilde{i}_f^*(s)} = \frac{1}{K}\frac{\tilde{v}_{DC}(s)}{\tilde{i}_{C_o}(s)} = \frac{1}{s(KC_o)}. \quad (38)$$

Equation (38) indicates that the emulated impedance $Z_e$ is equivalent to a capacitor that has a capacitance of $KC_o$. For example, if $C_o$=10 μF, and K=70, then $Z_e$ is emulating a 700 μF capacitor. While $C_o$ should be a small capacitor in the device, it should also be noted that the other capacitor $C_s$ used in FIG. 18(a) is also much smaller than the emulated capacitor $Z_e$. The reason is that the voltage across $C_s$ is allowed to rise to a level ($v_c$) which is much higher than $V_{DC}$. Based on the law of conservation of energy, the energy stored in the emulated capacitor is ½$Z_e$ $v_{DC}^2 \approx$ ½$C_s v_c^2$. Therefore, $Z_e > C_s$ for $v_c > V_{DC}$. In general, non-electrolytic capacitors are used for $C_o$ and $C_s$ because their capacitance sizes are small.

In FIG. 18 (a), an outer voltage control loop is incorporated (as indicated in by Vc) to regulate the averaged voltage for the capacitor Cs. In this way, the RP consumes only a very small amount of power that is used to compensate the power losses in RP. No extra DC power is consumed or generated.

Essentially, the $if^*$ is derived indirectly from $V_{DC}$, taking advantage of the small Co across the DC-bus. As shown in FIG. 18, the voltage across $C_s$ is compared to a reference. The difference voltage is applied to a proportional-integral (PI) controller to generate a current that is compared to the current though capacitor $C_o$. This difference is compared to the current through inductor $L_1$ to generate the signal for the current controller. This method makes the implementation simple, without complicated analogue circuit design, which could easily be interfered with by switching noises.

In this invention, the concept of emulating an impedance or a function can be further generalized. If $i_{C_o}$ is amplified by a general transfer function of $G_e(s)$, as shown in FIG. 18 (b), $Z_e$ can be derived as $$Z_e(s) = \frac{\tilde{v}_{DC}(s)}{\tilde{i}_f^*(s)} = \frac{1}{G_e(s)}\frac{\tilde{v}_{DC}(s)}{\tilde{i}_{C_o}(s)} = \frac{1}{s[G_e(s)C_o]}. \quad (39)$$

Equation (39) implies that $Z_e$ can be programmed to emulate a resistor, inductor, and even a non-linear device, if $G_e(s)$ is selected properly. Therefore, by designing or programming Ge(s) as a function desirable for an application, this plug-&-play device can be plugged into the dc voltage link of a power electronics system or a dc power grid to provide its designed function. Therefore, the control scheme with the $G_e(s)$ as a programmable function in FIG. 18(b) is more general than the specified case of $G_e(s)$=K in FIG. 18(a).

The general control scheme in FIG. 18 (b) forms the core element of this invention. If the general function Ge(s) is programmed as Ge(s)=K, the effect of providing an emulated capacitor is shown in FIG. 19, which illustrates the actual capacitance of Co used in the circuit and an emulated capacitor $C_{emulated}$ ($\approx KCo$) in the frequency domain.

In practice, the active filter can be improved by using a second-order low-pass filter (or any other type of filter), as long as the switching ripple of the switched mode converter forming the shunt plug-&-play device is filter off. When $G_e(s)$ is designed as a $2^{nd}$ order low-pass filter:

$$G_e(s) = K\underbrace{\frac{\omega_c^2}{s^2 + 2*0.7*\omega_c + \omega_c^2}}_{LPF} \quad (40)$$

where K=50, $\omega_c$=2*pi*1 kHz and $C_o$=10 μF and $C_s$=20 μF.

Note that the low-pass filter is typically required in a practical implementation in order to suppress the switching ripples in the sensed capacitor current $i_{Co}$. When the effect of the low-pass filter (LPF) part in Equation (40) to the emulated capacitance can be neglected, the relationship between the ideal capacitance of $C_o$ and the emulated capacitor $C_{emulated}$ is consistent with FIG. 19. FIG. 20 shows the theoretical bode plot of the magnitude and phase of the full function in Equation (40) (the effect of the low-pass filter is included).

To further improve the filter characteristic for application in which the double mains frequency is present, the active filter can also be programmed with extra filtering effect for the double mains frequency. This can be achieved by programming the plug-&-play device with a low-pass filter function and a proportional-resonant function (with the resonant frequency set at the double mains frequency).

When $G_e(s)$ is set as a $2^{nd}$ order low-pass filter plus a proportional resonant function:

$$G_e(s) = K\underbrace{\frac{\omega_c^2}{s^2 + 2*0.7*\omega_c + \omega_c^2}}_{LPF} \times \underbrace{\left(k_p + \frac{k_i\omega_{c2}s}{s^2 + \omega_{c2}s + \omega_r^2}\right)}_{RP} \quad (41)$$

where K=50, $\omega_c$=2*pi*1 kHz, $\omega_r$=2*pi*100 (where 100 Hz is the double mains frequency for a 50 Hz mains) and $C_o$=10 μF. With this arrangement the plug-&-play device can be programmable or designed with specific functions.

Instability might happen when the output impedance Zout of the source converter is larger than the input impedance of Zin (i.e. violating the Middlebrook criterion), even though each converter is individually designed to be stable on its own. After the RP (emulating a 700 μf capacitor) is used, the peak value of Zout is attenuated below Zin, thereby a stable $V_{DC}$.

The elements of the embodiments described above can be combined to provide further embodiments. These and other changes can be made to the system in light of the above detailed description. While the invention has been particularly shown and described herein, with reference to preferred embodiments thereof, it will be understood by those skilled in the art that various changes in form and details may be made therein without departing from the spirit and scope of the invention.

What is claimed is:

1. A power converter for stabilizing a DC-link interface to DC utilities and systems and which is connected to an AC/DC converter, comprising: first and second capacitors $C_o$, $C_s$ each with first and second ends, the first capacitor being connected across a DC link; an inductor L connected in series with a first switch $S_1$, the series being connected between the first end of the second capacitor $C_s$ and the DC link, a second switch $S_2$ connected between a junction of the first switch and the inductor and the second end of the second capacitor, and a control circuit that alternately operates said first switch and second switch to control the absorption of a DC ripple by presenting a variable impedance to the DC link; and wherein the power converter is connected to the DC-link interface without altering it so it functions as a two-port device that is plug-&-play.

2. The power converter of claim 1 wherein the control circuit only requires a voltage of the DC link.

3. The power converter of claim 1 wherein it is programmable to provide different types of impedance.

4. The power converter of claim 1 wherein the control circuit operates at a frequency higher than double the frequency of an input AC of the AC/DC converter.

5. The power converter of claim 1 wherein the control circuit comprises: a first comparator that compares the voltage across the second capacitor with a reference voltage and creates a first error signal; a converter for changing the first error signal into a first current signal; a functional modifier that modifies the current through the first capacitor to a second current signal; a second comparator for comparing the first and second current signals to generate a third current signal; a third comparator for comparing the current through the inductor to the third current signal to generate a fourth current signal; a current controller that converts the fourth current signal into switching signals for the first switch and second switch.

6. The power converter of claim 5 wherein the functional modifier is a capacitance multiplier.

7. The power converter of claim 5 wherein the functional modifier is a generalized impedance that can be programmed to emulate different impedances.

8. The power converter of claim 7 wherein the generalized impedance can be programmed to be one of a resistor, inductor or non-linear device.

9. A DC voltage system that provides DC voltage to DC utilities and systems, comprising: a power converter for providing the DC voltage to a DC link to which the DC utilities and systems are connected; and a ripple pacifier connected across the DC link, said ripple pacifier presenting variable impedance to the DC link so as to reduce an AC ripple in the DC link, said ripple pacifier relying only on the DC voltage for control and not adversely affecting the DC link.

10. The DC system of claim 9 wherein the power converter is a boost PFC rectifier.

11. The DC system of claim 9 wherein the power converter is a buck boost converter.

12. The DC system of claim 9 wherein the power converter is one of a step-up, step-down or step-up/down power electronics converter or an AC/DC converter including a full-bridge converter, half-bridge converter and multi-level converter or their derivative or combination.

13. The DC system of claim 9 wherein the power converter acts to perform at least one of the following: an emulated impedance, active power filter, voltage ripple reduction or improved stability margin of DC voltage linked power stages.

14. The DC system of claim 9 wherein the power converter acts as a second ripple pacifier to suppress or filter voltage ripple of a particular frequency that doubles main frequency commonly occurred in an AC-DC power converter systems.

15. A method for controlling an AC ripple from a switched mode power electronic converter connected to a DC link of a host DC voltage system, comprising the steps of: providing a two terminal device across the DC link; causing the two terminal device to emulate the AC ripple and to reflect the AC ripple in the impedance it presents to the DC link so as to reduce the AC ripple; causing the impedance to be presented in such a way as to not alter the DC link; controlling the two terminal device based on the measurement of the DC link.

16. The method of claim 15, wherein the step of controlling involves alternately switching impedance elements in the two terminal device to vary the impedance presented by the two terminal device.

17. The method of claim 15 wherein the step of controlling operates at a frequency higher than double the frequency of the AC ripple.

* * * * *